United States Patent [19]
Hara et al.

[11] Patent Number: 5,825,463
[45] Date of Patent: Oct. 20, 1998

[54] MASK AND MASK SUPPORTING MECHANISM

[75] Inventors: Shinichi Hara, Saitama-ken; Nobutoshi Mizusawa, Yamato; Yuji Chiba, Isehara, all of Japan

[73] Assignee: Canon Kabushiki Kaisha, Tokyo, Japan

[21] Appl. No.: 791,545

[22] Filed: Jan. 31, 1997

Related U.S. Application Data

[63] Continuation of Ser. No. 401,701, Mar. 10, 1995, abandoned.

[30] Foreign Application Priority Data

Mar. 15, 1994 [JP] Japan .................................. 6-043903

[51] Int. Cl.⁶ .................................................. G03B 27/62
[52] U.S. Cl. .................................................. 355/75; 355/72
[58] Field of Search ............................... 355/72, 75, 53; 430/5

[56] References Cited

U.S. PATENT DOCUMENTS

| | | | |
|---|---|---|---|
| 3,844,655 | 10/1974 | Johannsmeier | 355/43 |
| 3,950,095 | 4/1976 | Bouygues et al. | 355/72 |
| 4,189,230 | 2/1980 | Zasio | 355/76 |
| 4,284,678 | 8/1981 | Jones | 428/195 |
| 4,473,293 | 9/1984 | Phillips | 355/53 |
| 4,748,478 | 5/1988 | Suwa et al. | 355/53 |
| 4,764,791 | 8/1988 | Omata et al. | 355/26 |
| 4,811,059 | 3/1989 | Hamasaki et al. | 355/7 |
| 4,820,930 | 4/1989 | Tsutsui et al. | 250/548 |
| 4,924,258 | 5/1990 | Tsutsui | 355/53 |
| 5,021,821 | 6/1991 | Suzuki | 355/53 |
| 5,026,239 | 6/1991 | Chiba et al. | 414/217 |
| 5,093,579 | 3/1992 | Amemiya et al. | 250/453.1 |
| 5,160,961 | 11/1992 | Marumo et al. | 355/53 |
| 5,161,177 | 11/1992 | Chiba | 378/34 |
| 5,168,306 | 12/1992 | Morimoto et al. | 355/53 |
| 5,191,218 | 3/1993 | Mori et al. | 250/453.11 |
| 5,224,139 | 6/1993 | Korenaga et al. | 378/34 |
| 5,253,012 | 10/1993 | Chiba et al. | 355/53 |
| 5,317,615 | 5/1994 | Ebinuma et al. | 378/34 |
| 5,356,686 | 10/1994 | Fujioka et al. | 428/65 |
| 5,386,269 | 1/1995 | Kosugi | 355/72 |
| 5,411,823 | 5/1995 | Okamoto | 430/5 |
| 5,534,969 | 7/1996 | Miyake | 355/53 |

OTHER PUBLICATIONS

Patent Abstracts of Japan, Kokai No. 61–264,725, vol. 11, No. 117, E–498, Apr. 1987.

Primary Examiner—Safet Metjahic
Assistant Examiner—John Chizmar
Attorney, Agent, or Firm—Fitzpatrick, Cella, Harper & Scinto

[57] ABSTRACT

A mask and a mask supporting mechanism wherein the outside periphery of a mask frame, having a rectangular shape, which supports the mask, is supported at three supporting points which are substantially the same distance from the center line of a mask membrane, whereby the mask frame is positioned with respect to X, Y and θ directions. Two pressing mechanisms press the mask frame at two points substantially opposed to two of the supporting points. The mask is supported at three points on the bottom surface thereof for positioning in the Z direction.

10 Claims, 28 Drawing Sheets

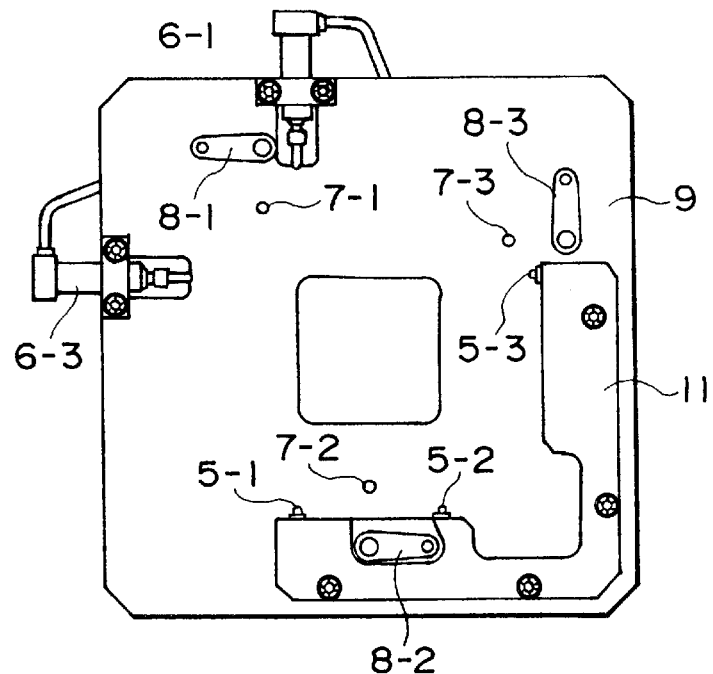
F I G. 2A
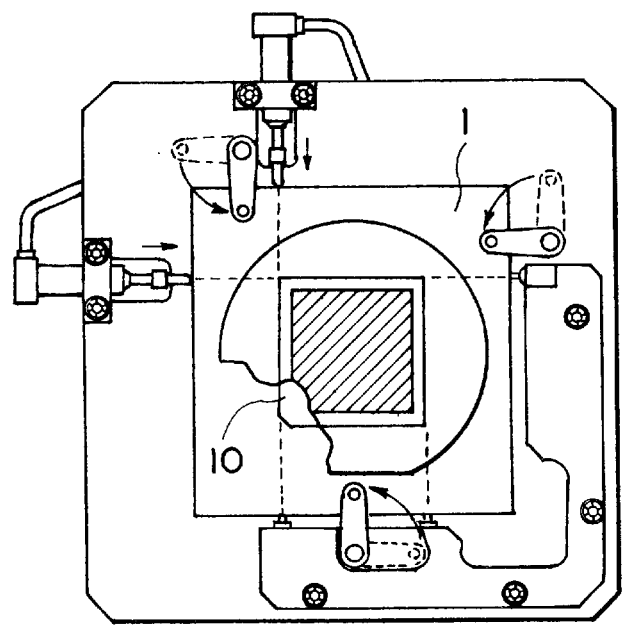
F I G. 2B

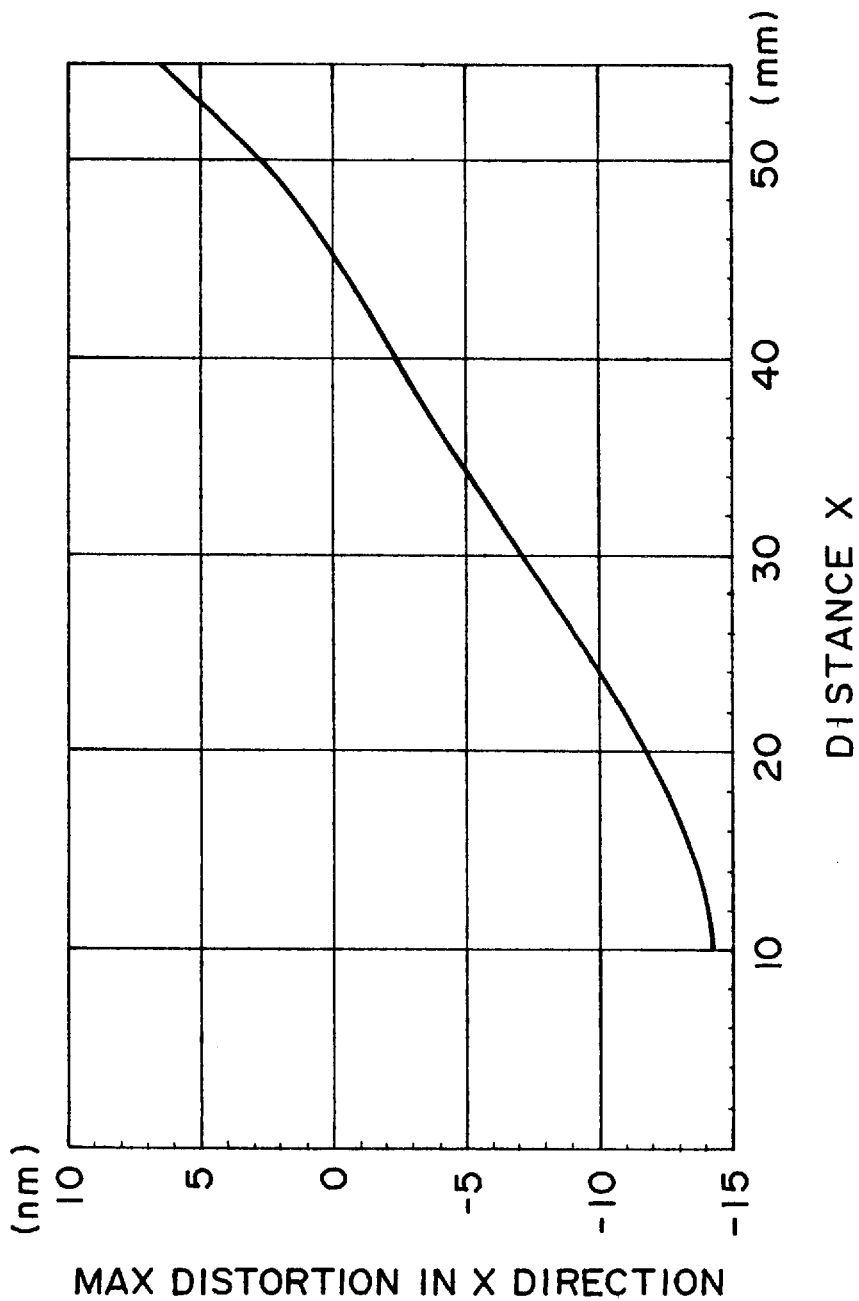
F I G. 5

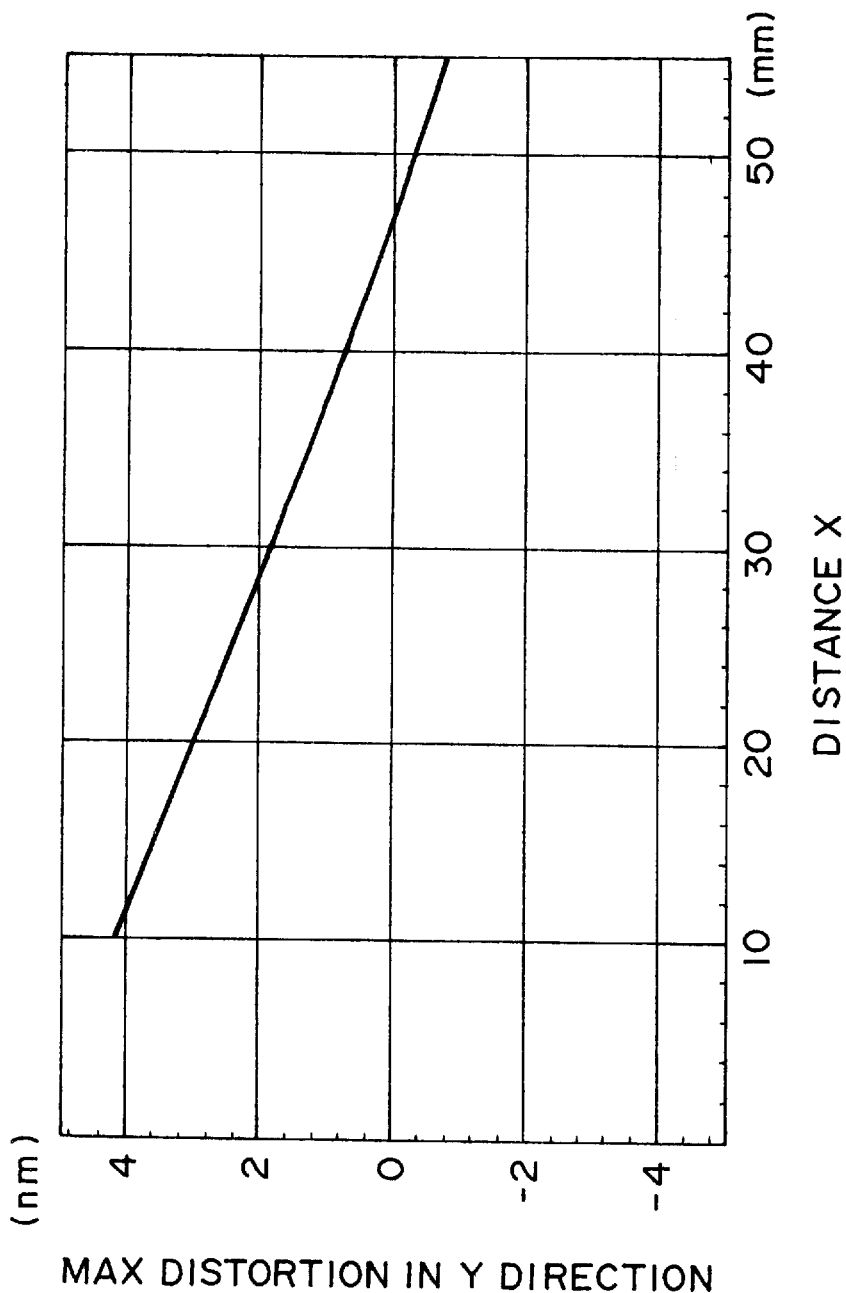
F I G. 13

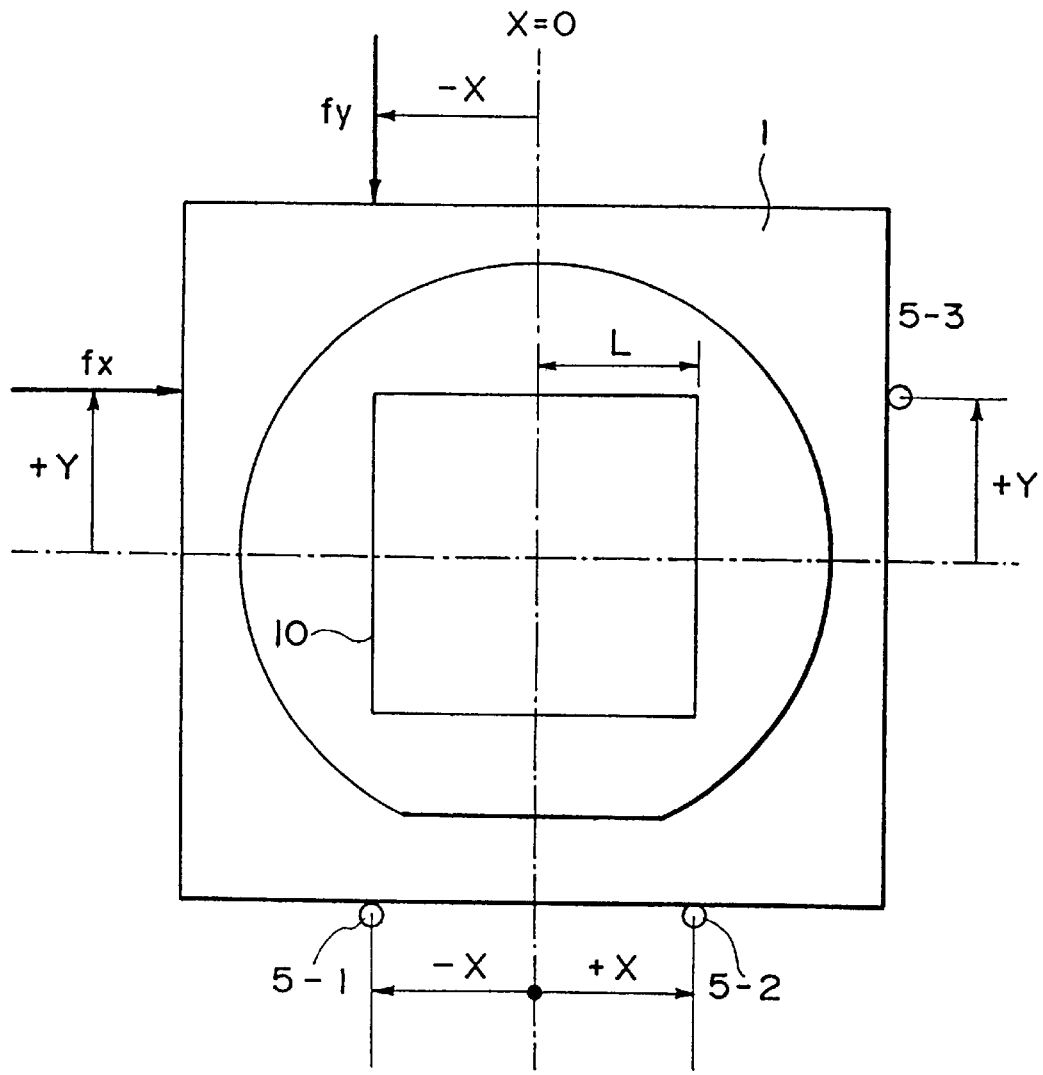
F I G. 14A
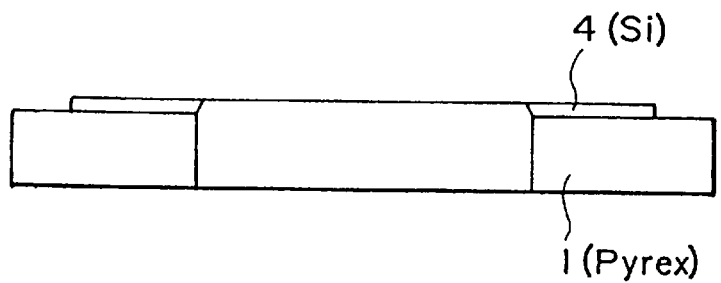
F I G. 14B

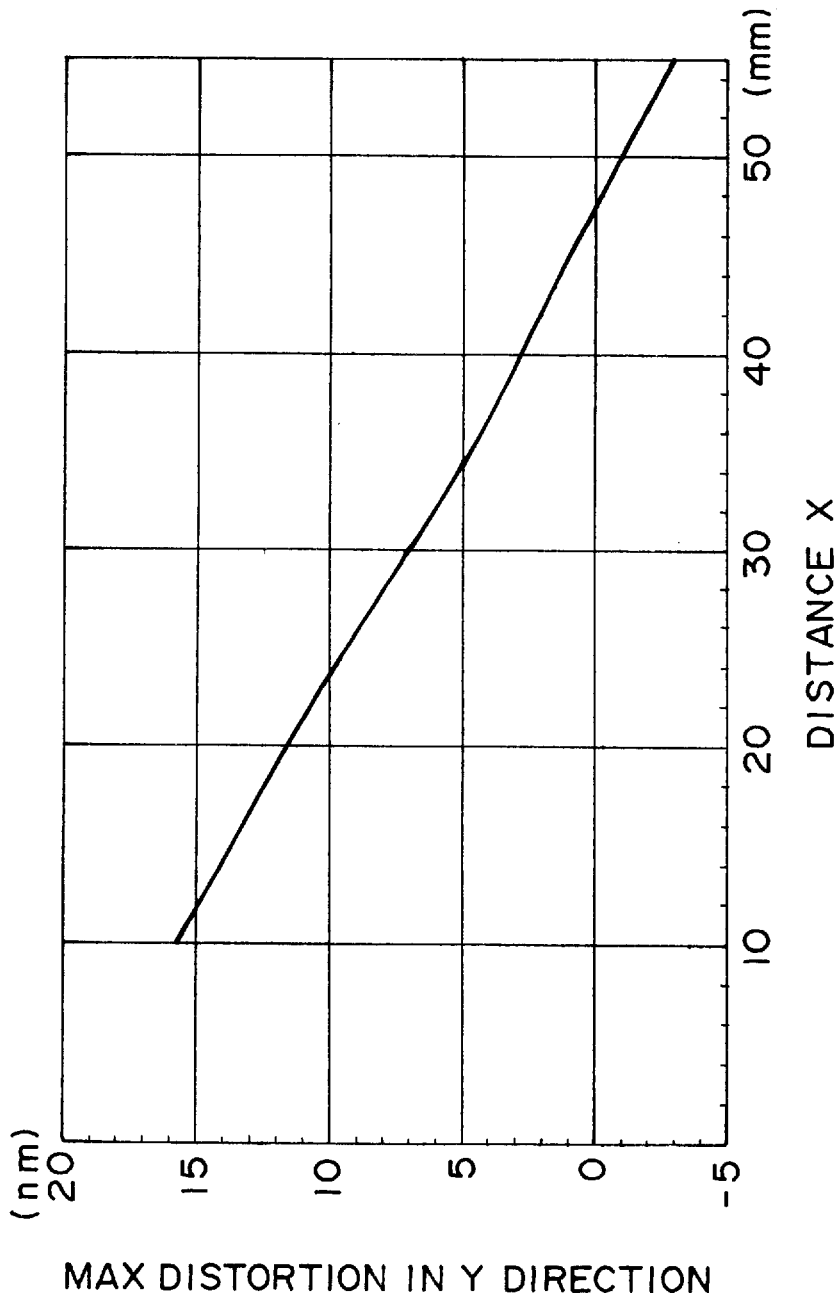
F I G. 16

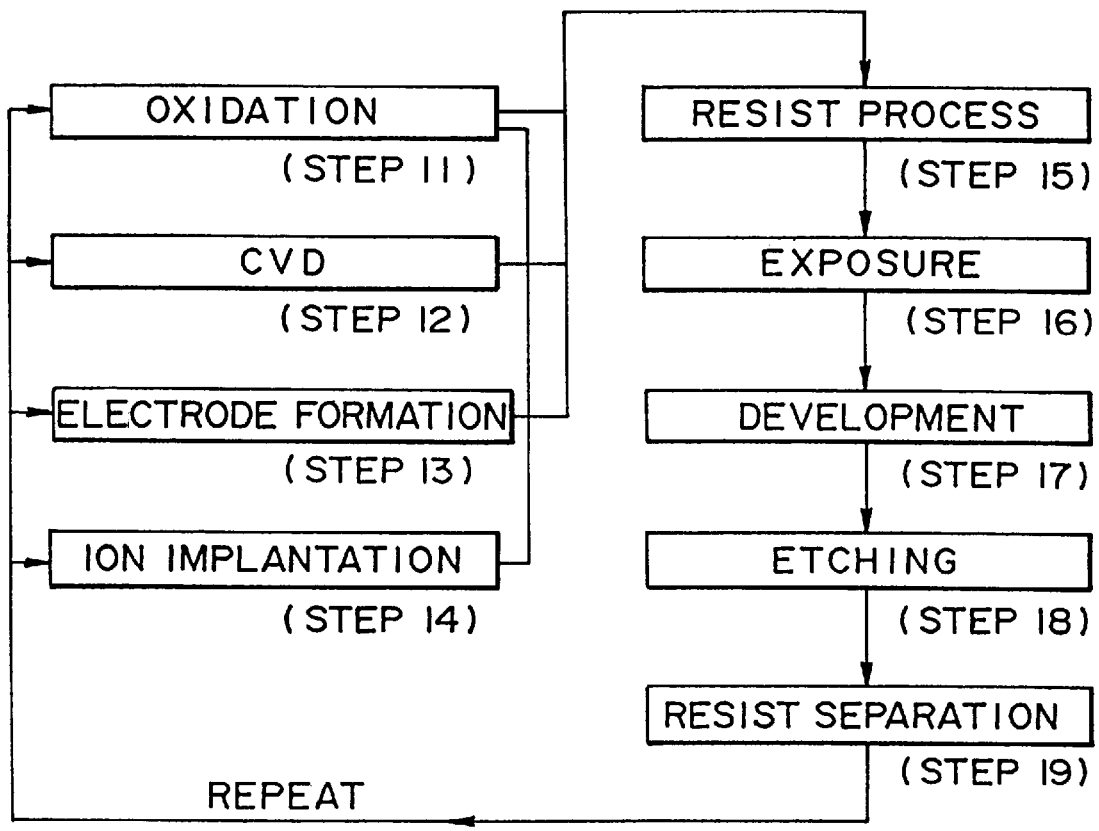
F I G. 26

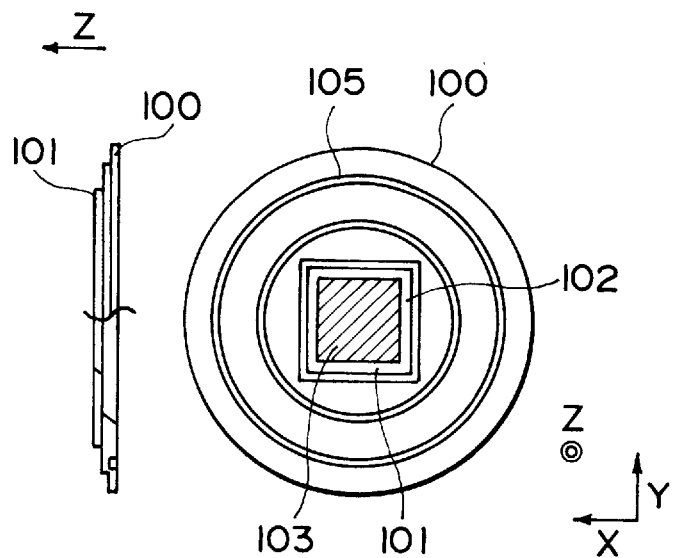
F I G. 27A
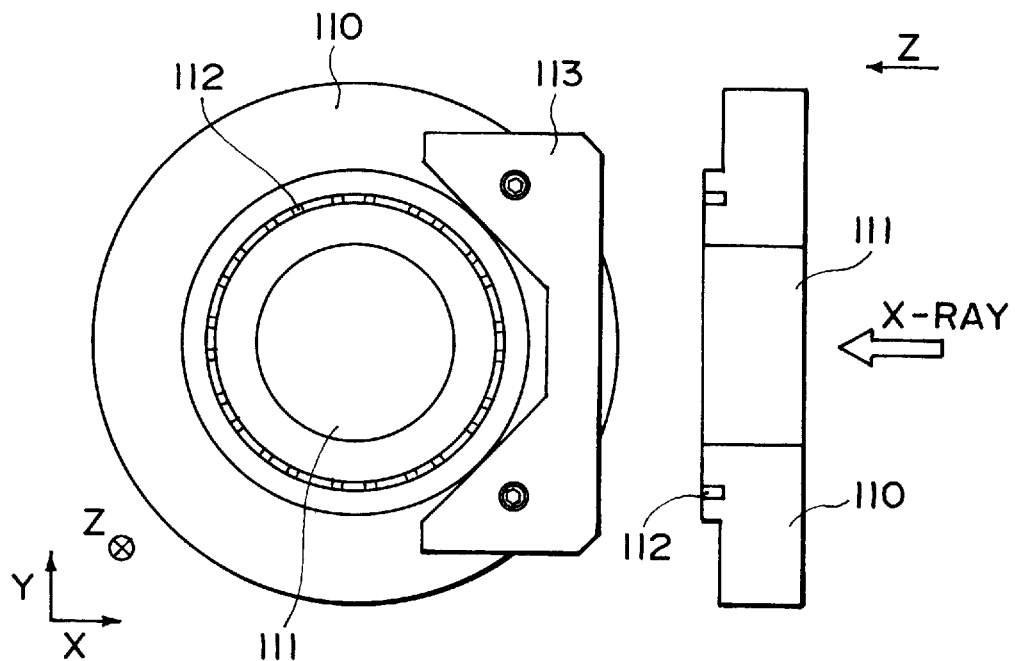
F I G. 27B

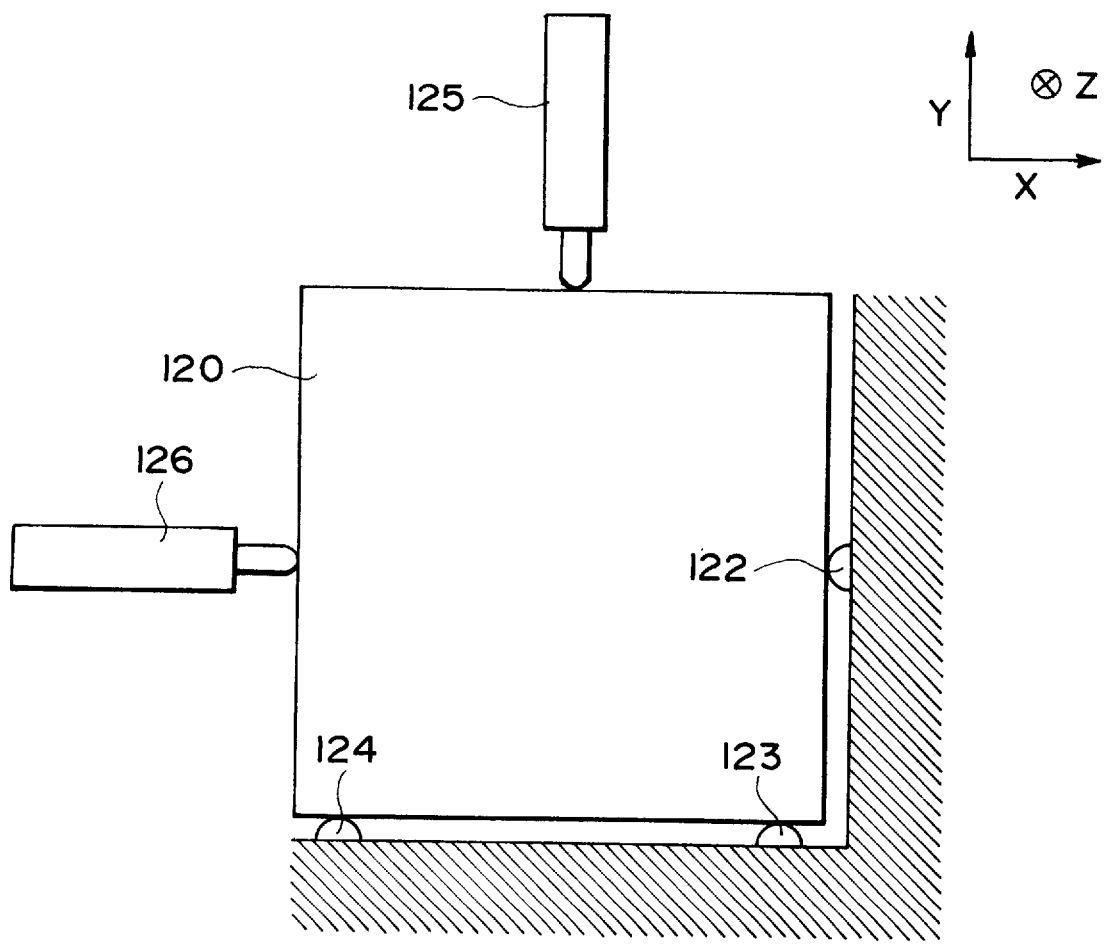
F I G. 28

MASK AND MASK SUPPORTING MECHANISM

This application is a continuation of application Ser. No. 08/401,701, filed Mar. 10, 1995, now abandoned.

FIELD OF THE INVENTION AND RELATED ART

This invention relates to a mask and a mask supporting mechanism suitably usable in an X-ray exposure apparatus, for example.

In the manufacture of semiconductor devices with exposure apparatuses, the line width of a device to be printed becomes narrower and narrower to meet further increases in the degree of integration of a device. As an example, for 256 MDRAM, a line width of 0.25 micron is required and, for 1 GDRAM, a line width of 0.18 micron is required. To meet such requirements, the overall registration precision should be 80 nm (256 MDRAM) or 60 nm (1 GDRAM). In many cases, i-line light or a KrF laser is used as exposure light. However, in order to avoid degradation of resolution due to diffraction, recently an X-ray exposure apparatus which uses shorter wavelength X-rays has an much attention.

FIGS. 27A and 27B are schematic views, respectively, illustrating a known example of an X-ray mask and a mask chuck incorporated into an X-ray exposure apparatus. FIG. 27A shows the structure of an X-ray mask, wherein denoted at 100 is a circular mask frame having a ring-like shape. Denoted at 101 is a mask substrate made of Si. Denoted at 102 is a membrane formed by back-etching a portion of the mask substrate. Denoted at 103 is a pattern to be transferred, which is formed on the mask membrane by drawing through an EB (electron beam) drawing apparatus, for example. Denoted at 105 is a magnetic ring made of a magnetic material, for example, which is embedded in the mask frame 100.

FIG. 27B shows a mask chuck of magnetic attraction type. Denoted at 110 is a chuck base having a window 111 formed therein, for passage of exposure X-rays. Denoted at 112 are magnetic units disposed circumferentially in accordance with the magnetic ring 105, which serve to produce a magnetic force sufficient to attract an X-ray mask. In this structure, the mask frame 100 of the X-ray mask is positioned with respect to X and Y directions, by abutting it against a V-shaped block 113. After this, it is magnetically attracted to the holding surface of the chuck base 110. Other than this magnetic attraction type, a vacuum attraction type is available and, in that occasion, the magnetic units are replaced by vacuum ports such that a mask is attracted and held by a vacuum force.

In the field of optical exposure apparatuses using i-line light or a KrF laser, a reticle positioning mechanism such as shown in FIG. 28 is known. In this mechanism, a pressing mechanism 126 and a supporting member 122 cooperate to perform the positioning of a reticle 120 of rectangular shape with respect to the X direction. Pressing mechanism 125 and two supporting members 123 and 124 serve to perform the positioning of the reticle 120 with respect to the Y direction as well as the control of position with respect to the θ direction. Here, to diffuse the pressing force isotropically, the pressing mechanisms 125 and 126 serve to press the central portions of the outside periphery of the reticle, as illustrated.

The reticle 120 may be made by forming a Cr pattern on a transparent substrate such as fused silica, for example, having a relatively high rigidity, and it does not specifically use a reinforcing member such as a frame. In a case of an X-ray mask, however, the membrane which bears a pattern is made very thin in order to reduce the X-ray absorption as much as possible, and usually the thickness of it is about 2 microns. Thus, the rigidity of it is very small as compared with that of a transparent plate of a reticle. It can be easily deformed by an external force transmitted thereto from the frame, this resulting in deviation of the pattern to be transferred. This problem might be peculiar to an X-ray mask having a structure that a pattern is formed on an extraordinarily thin membrane being provided in accordance with the window of a mask frame.

This means that, if an X-ray mask having a mask frame of rectangular shape is used and the positioning of this X-ray mask is performed in a similar manner as illustrated in FIG. 28, there is a possibility of application of external force to a portion of the mask frame having low rigidity which causes large distortion of the pattern. According to the investigations made by the inventors of the subject application, it has been confirmed that, in a case where a mask frame comprises a heat-resistive glass having a thickness of 6 mm and having a rectangular window of a size 55 mm square, if it is supported as shown in FIG. 28 and a pressing force of 0.46 N is applied thereto, there occurs a positional deviation of the membrane in the Y direction of an amount of 19 nm at the largest. In order to satisfy the overall registration precision of 80 nm (for a 256 MDRAM), for example, the tolerance for mechanical distortion of a mask is on an order of 14 nm and, therefore, the 19 nm positional deviation mentioned above is far beyond this tolerance.

SUMMARY OF THE INVENTION

It is accordingly an object of the present invention to provide a mask supporting method and/or a mask chuck by which distortion to be applied to a mask pattern is reduced significantly.

It is another object of the present invention to provide a mask which can be suitably supported by or in accordance with the mask chuck or the mask supporting method mentioned above.

It is a further object of the present invention to provide a high precision exposure apparatus which suitably uses the mask supporting method or the mask chuck mentioned above.

It is a further object of the present invention to provide a high precision device manufacturing method which suitably uses the mask supporting method or the mask chuck mentioned above.

In accordance with an aspect of the present invention, there is provided a mask having a mask frame, a window of rectangular shape being formed inside the mask frame, a membrane having an X-ray transmitting portion of a shape and size substantially the same as those of the window, and a pattern formed on the mask membrane.

In accordance with another aspect of the present invention, there is provided a mask supporting method in which the outside periphery of a mask frame of rectangular shape is supported, at three supporting points thereon and at least two pressing points which are substantially opposed to the supporting points.

In accordance with a further aspect of the present invention, there is provided a mask supporting mechanism which includes three supporting members and at least two pressing mechanisms opposed to the supporting members, for supporting the outside periphery of a mask frame of rectangular shape. The mask supporting mechanism may further include a supporting mechanism for supporting the mask frame at plural points upon the bottom face of the mask frame.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A and 2B are schematic views, respectively, of a mask chuck mechanism according to an embodiment of the present invention.

FIG. 5 is a graph for explaining maximum distortion of a membrane in the X direction, in the model of FIGS. 4A and 4B.

FIG. 13 is a graph for explaining maximum distortion of a membrane in the Y direction, in the model of FIGS. 11A and 11B.

FIGS. 14A and 14B are schematic views, respectively, for explaining a further model to be considered, in an embodiment of the present invention.

FIG. 16 is a graph for explaining maximum distortion of a membrane in the Y direction, in the model of FIGS. 11A and 11B.

FIG. 26 is a flow chart of details of a wafer process.

FIGS. 27A and 27B are schematic views of a known example of a mask chuck in an X-ray exposure apparatus.

FIG. 28 is a schematic view of a known reticle chuck in an optical exposure apparatus.

DESCRIPTION OF THE PREFERRED EMBODIMENTS

Preferred embodiments of the present invention will be explained below. While in the following description an X-ray mask will be explained as an example, the present invention is not limited to a case using X-rays but it is applicable also to a mask of similar structure, such as a mask for use with vacuum ultraviolet rays, for example.

[Embodiment 1]

Figure 1A:
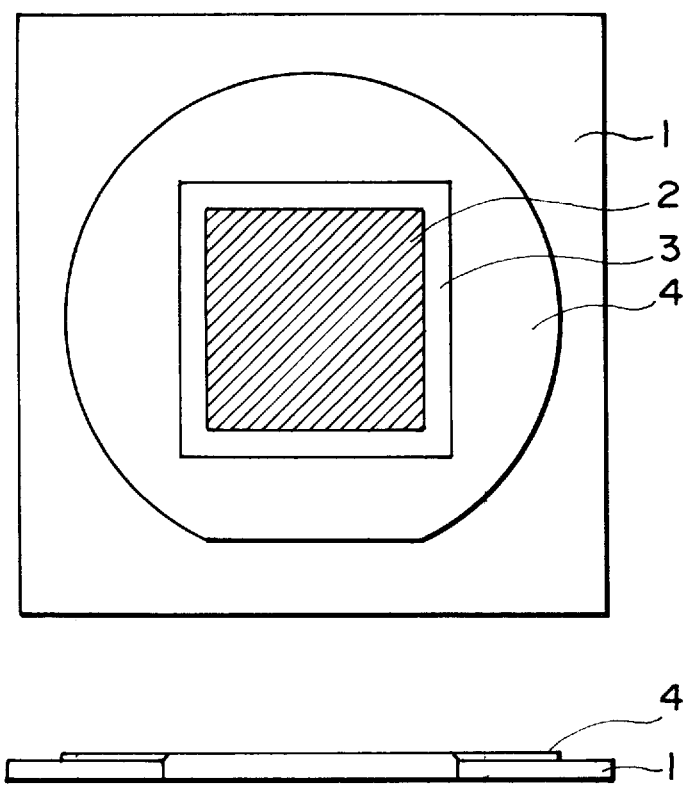
FIGS. 1A and 1B are schematic views, respectively, for explaining the structure of an X-ray mask according to an embodiment of the present invention.
Figure 1B:
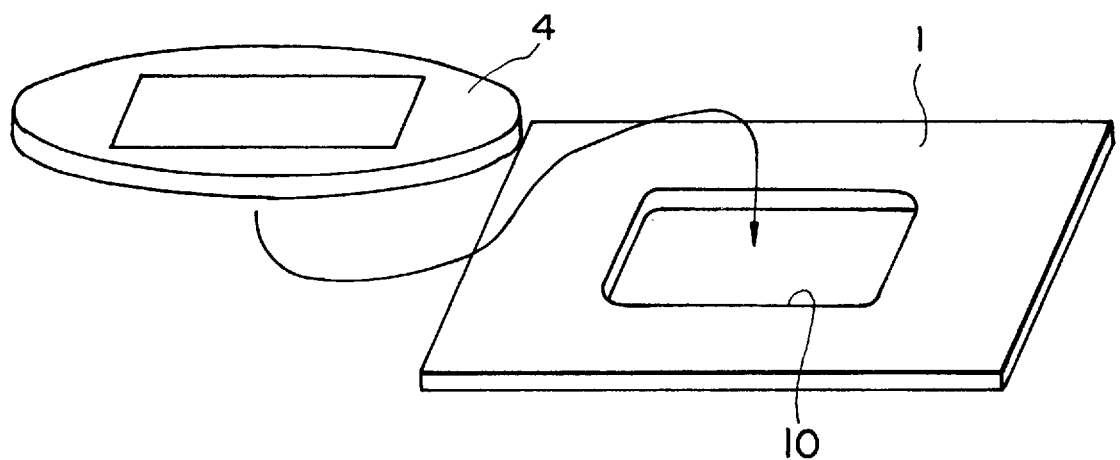

FIGS. 1A and 1B show the structure of an X-ray mask according to a first embodiment of the present invention, wherein FIG. 1A illustrates a top plan view and a sectional view, and FIG. 1B illustrates an assembling view. Denoted in these drawings at 1 is a mask frame which has a square or rectangular shape, for ease in handling of the same during a conveyance or positioning operation. Inside the mask frame 1 is there is a window 10 of rectangular shape analogous to the outside peripheral shape of the frame. As regards the material of the mask frame 1, a low thermal expansion glass or any other low thermal expansion material such as, for example, Si or a low thermal expansion ceramics (e.g. SiC or SiN), may be used. Denoted at 4 is a silicon wafer which provides the substrate of the mask. The mask substrate 4 is fixed to the mask frame 1, by means of adhesion or anode fixation. Denoted at 3 is a membrane made of SiN, for passage of X-rays therethrough. This membrane is formed by forming a SiN film on the mask substrate 4 of Si through a CVD process and by removing the Si material in a rectangular portion corresponding to the X-ray transmitting area through an etching process. Here, the window 10 formed in the mask frame 1 and the X-ray transmission area defined in the membrane 3 have substantially the same shape and the same size. In this X-ray transmission area of the membrane 3, there is formed a pattern 2 to be transferred, such as a circuit pattern for a semiconductor device. This pattern 2 is made of an X-ray absorbing material such as a heavy metal (e.g. Au), and it is formed through a film forming process subsequent to a pattern exposure (printing) process with the use of an EB (electron beam) drawing apparatus, for example.

FIGS. 2A and 2B show a mask chuck mechanism which is incorporated in an X-ray exposure apparatus, wherein FIG. 2A illustrates the mechanism in a state where no mask is held while FIG. 2B illustrates the mechanism in a state where a mask is held. This mask chuck mechanism is arranged to hold a mask in an upright position, along the direction of gravity.

Denoted in these drawings at 9 is a chuck base, and denoted at 11 is a block which is fixed to the chuck base and which has a shape with a recess for a mask hand during conveyance. Denoted at 5-1 and 5-2 are supporting members provided on the block 11, each comprising a rigid ball of half sphere shape. These supporting members are placed at those positions, as shown in FIG. 2B, which are on downward extensions from two sides, of the four sides of the rectangular window 10 of the mask frame 1 as held, which two sides extend parallel to the Y axis. Denoted at 6-1 is a pressing mechanism including an air cylinder, which is disposed at a position opposed to the supporting member 5-1 via the mask frame. Thus, the pressing mechanism 6-1 serves to apply a pressing force toward the supporting member 5-1 to thereby position the mask frame 1 with respect to the Y direction. Here, due to the supporting through the supporting members 5-1 and 5-2, any rotation of the mask frame in the Z direction is restricted. It is not always necessary that these members are placed exactly on the extensions of the two sides mentioned above, but they may be placed substantially along these extensions.

Similarly, denoted at 5-3 is a supporting member provided on the mask chuck and it comprises a rigid ball of semi-spherical shape. It is disposed on an extension from one (upper one) side, of the four sides of the rectangular window 10 of the mask frame 1 as held, which one side extends parallel to the X axis. Along this extension and at a position opposed to this supporting member via the mask frame 1, there is a pressing mechanism 6-3 which includes an air cylinder. By means of this pressing mechanism 6-3, the mask frame 1 can be positioned with respect to the X direction. Similarly, it is not always necessary that these members be placed exactly on the extension of the one side as mentioned above, but they may be placed substantially along the extension.

In conventional attraction and holding systems such those as of magnetic attraction type or vacuum attraction type, a mask frame and a chuck surface contact each other through "surface contact". It is therefore necessary that their contact surfaces should be finished to a very high surface flatness. According to the investigations made by the inventors of the subject application, it has been confirmed that only a difference in surface flatness of these members of 0.3 micron causes a positional deviation of a pattern of 90 nm when the frame has a thickness of 13 mm. Even if the frame thickness is 2 mm, a positional deviation of the pattern of 27 nm occurs through the chucking operation. Thus, in the present embodiment, in order to avoid the effect of surface precision such as described above, the support in the direction out of the surface (i.e., in the Z direction) is performed at three points and, on the other hand, correction of warp during the mask chucking operation is not made. As a mechanism therefor, there are supporting members 7-1, 7-2 and 7-3 provided on the chuck base 9 each comprising a rigid ball of semi-spherical shape, and clamp mechanisms 8-1, 8-2 and 8-3 disposed opposed to the supporting members 7-1, 7-2 and 7-3, respectively. Each clamp mechanism is arranged to be moved by an actuator means having a rotation and translation mechanism, during the X-ray mask mounting/demounting operation, to a position not interfering with this operation. An X-ray mask having been positioned with respect to the X, Y and θ directions as described above, is pressed toward the chuck base 9 by means of these supporting members and the clamp mechanisms, whereby the positioning of it with respect to the Z direction is accomplished. Since this positioning in the Z direction is executed at three points, the mask can be held without surface flatness correction (as in conventional attraction systems) which may cause deformation along the surface.

Figure 4A:
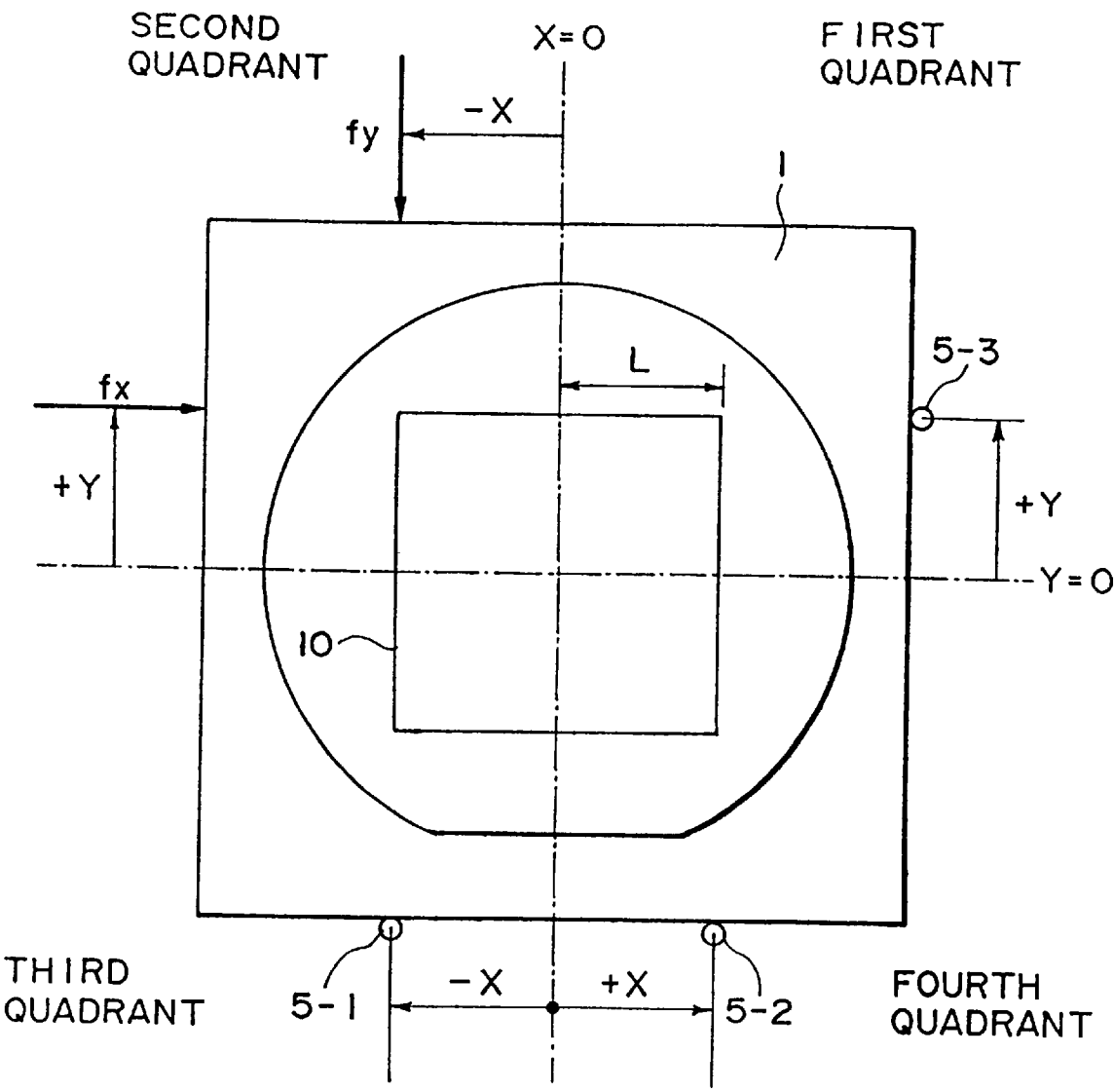
FIGS. 4A and 4B are schematic views, respectively, for explaining a model to be considered in an embodiment of the present invention.
Figure 4B:
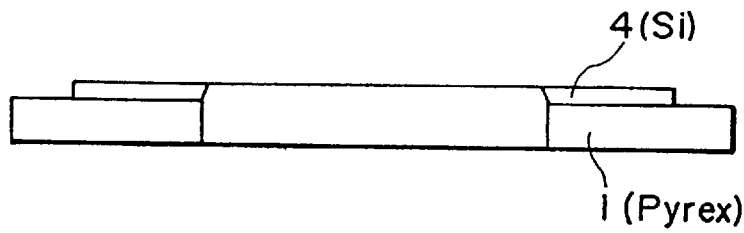

FIGS. 4A and 4B illustrate a model of a mask in the state that the positioning with respect to the X, Y, θ and Z directions such as described above has been completed. The pressing force is taken as a product of "mask weight" and "friction coefficient", and 0.46N is applied. The side of the rectangular window of the mask frame 1 is at a distance 27.5 mm in the X direction from the center.

Figure 6:
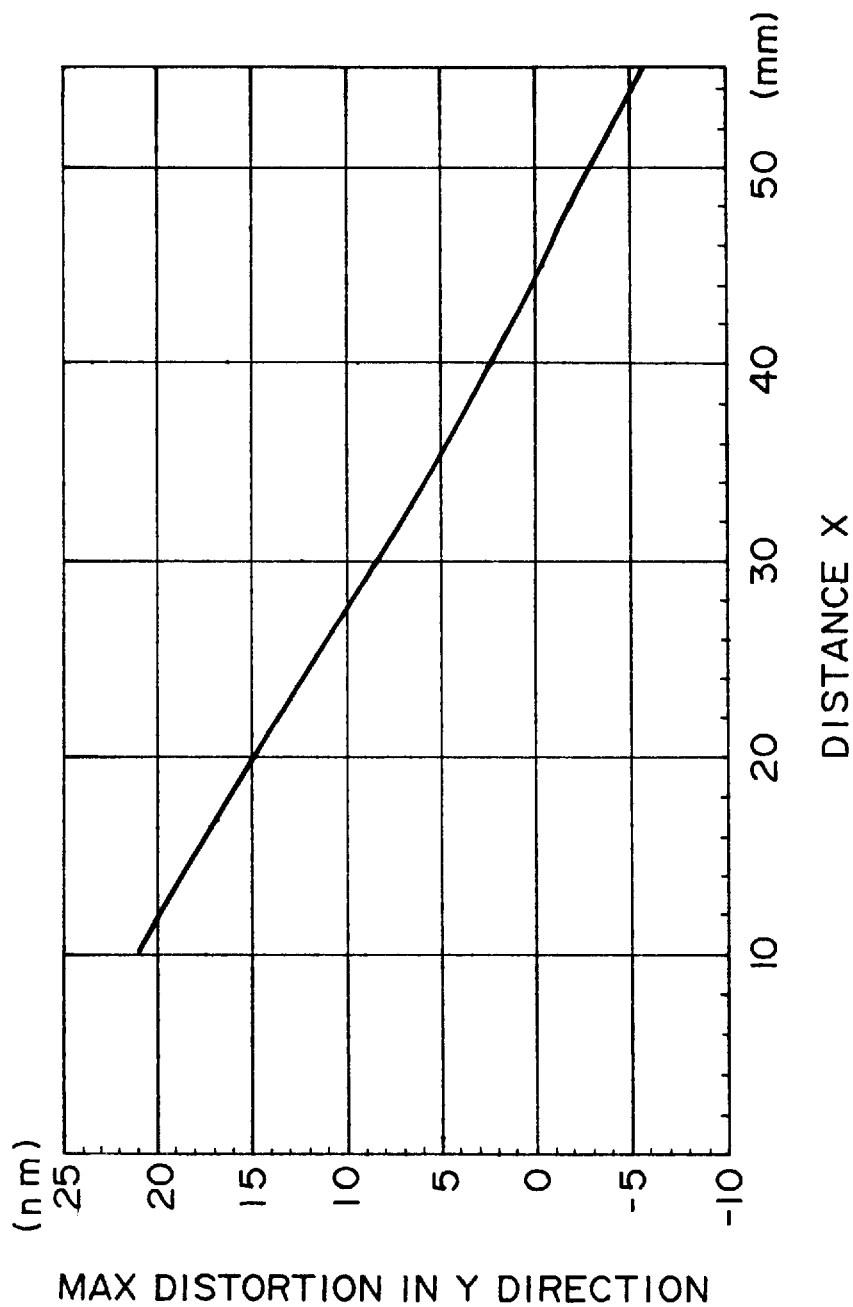
FIG. 6 is a graph for explaining maximum distortion of a membrane in the Y direction, in the model of FIGS. 4A and 4B.

FIG. 5 is a graph which shows maximum distortion of the membrane 3 in the X direction, when in the model of FIGS. 4A and 4B the distance Y in the Y direction of the supporting member 5-3 and the pressing mechanism 6-3 from the center is 44 mm and when the distance X in the X direction of the supporting members 5-1 and 5-2 and the pressing mechanism 6-1 from the center is changed. Here, the amount of distortion is taken as the amount of change in length of the membrane in the X direction or Y direction. Similarly, FIG. 6 is a graph which shows maximum distortion of the membrane 3 in the Y direction, when the distance X in the X direction of the supporting members 5-1 and 5-2 and the pressing mechanism 6-1 is changed. As seen from FIG. 5, as regards the distortion in the X direction, it is about zero at a distance X of about 45 mm. Also, it is seen from FIG. 6 that, as regards the distortion in the Y direction, it becomes minimum at a distance X of about 45 mm.

Figure 7:
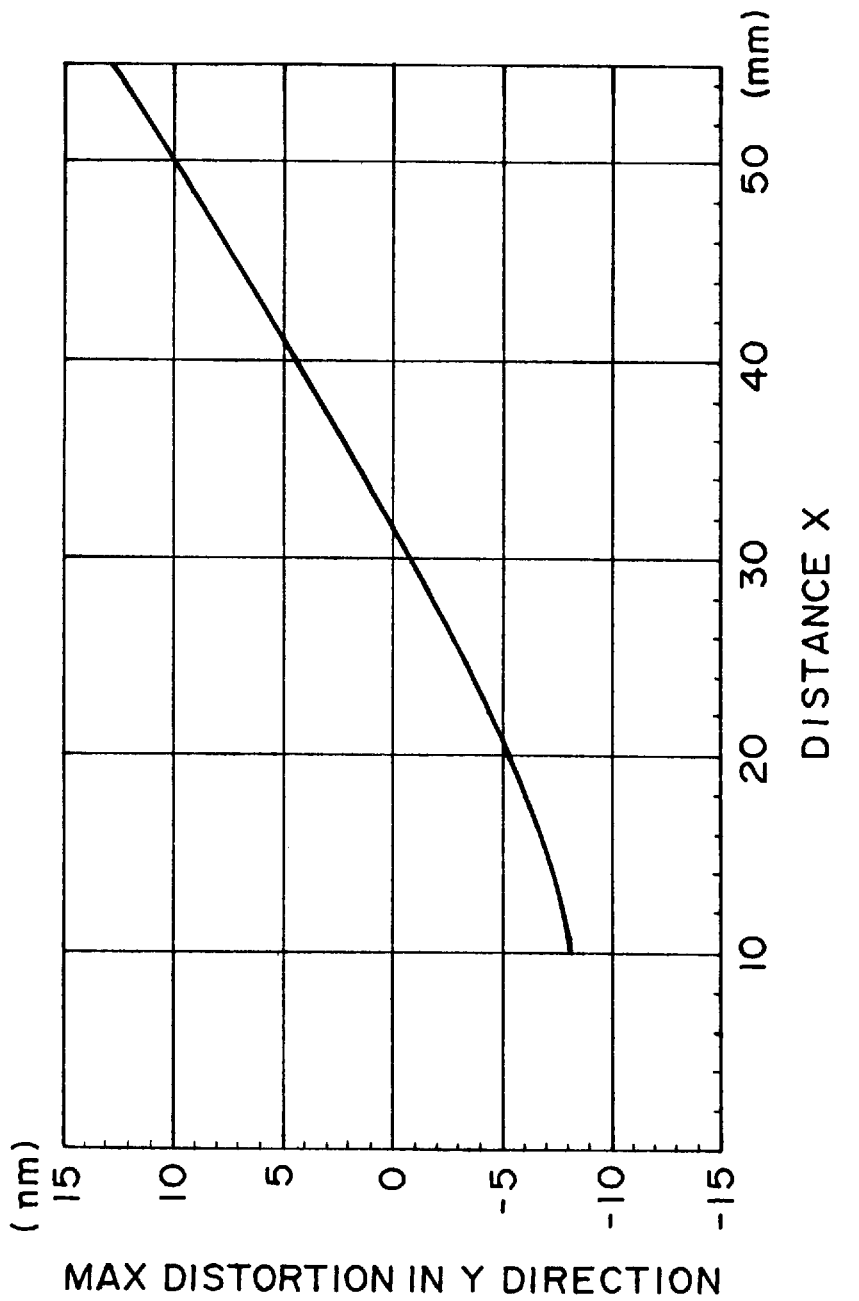
FIG. 7 is a graph for explaining maximum distortion of a membrane in the X direction, in the model of FIGS. 4A and 4B.
Figure 8:
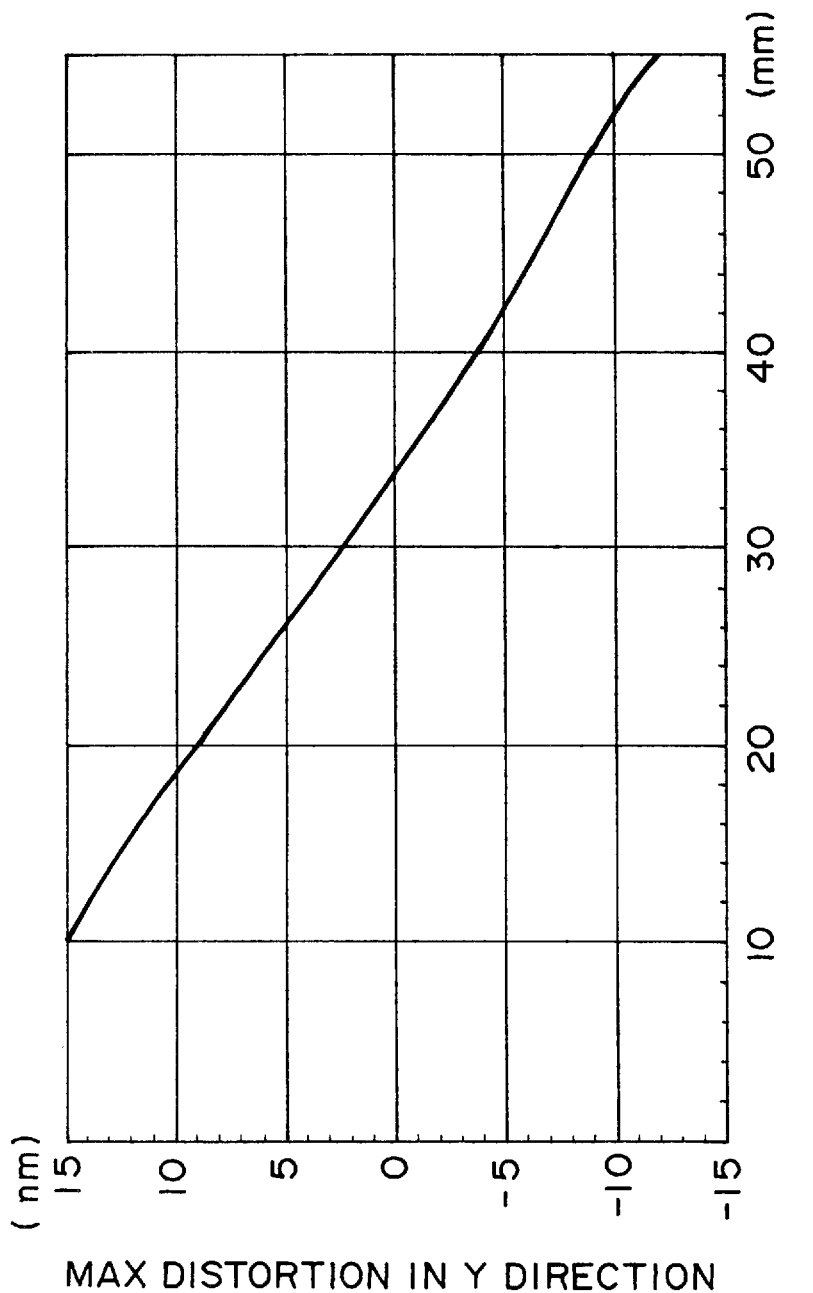
FIG. 8 is a graph for explaining maximum distortion of a membrane in the Y direction, in the model of FIGS. 4A and 4B.

FIG. 7 is a graph which shows the maximum distortion of the membrane 3 in the X direction, when in the model of FIGS. 4A and 4B the distance Y in the Y direction of the supporting member 5-3 and the pressing mechanism 6-3 from the center is 33 mm and when the distance X in the X direction of the supporting members 5-1 and 5-2 and the pressing mechanism 6-1 from the center is changed. Here, the amount of distortion is taken as the amount of change in length of the membrane in the X or Y direction. Similarly, FIG. 8 is a graph which shows maximum distortion of the membrane 3 in the Y direction, when the distance X in the X direction of the supporting members 5-1 and 5-2 and the pressing mechanism 6-1 is changed. As seen from FIG. 7, as regards the distortion in the X direction, it is about zero at a distance X of about 32 mm. Also, it is seen from FIG. 8 that, as regards the distortion in the Y direction, it becomes minimum at a distance X of about 34 mm.

Figure 9:
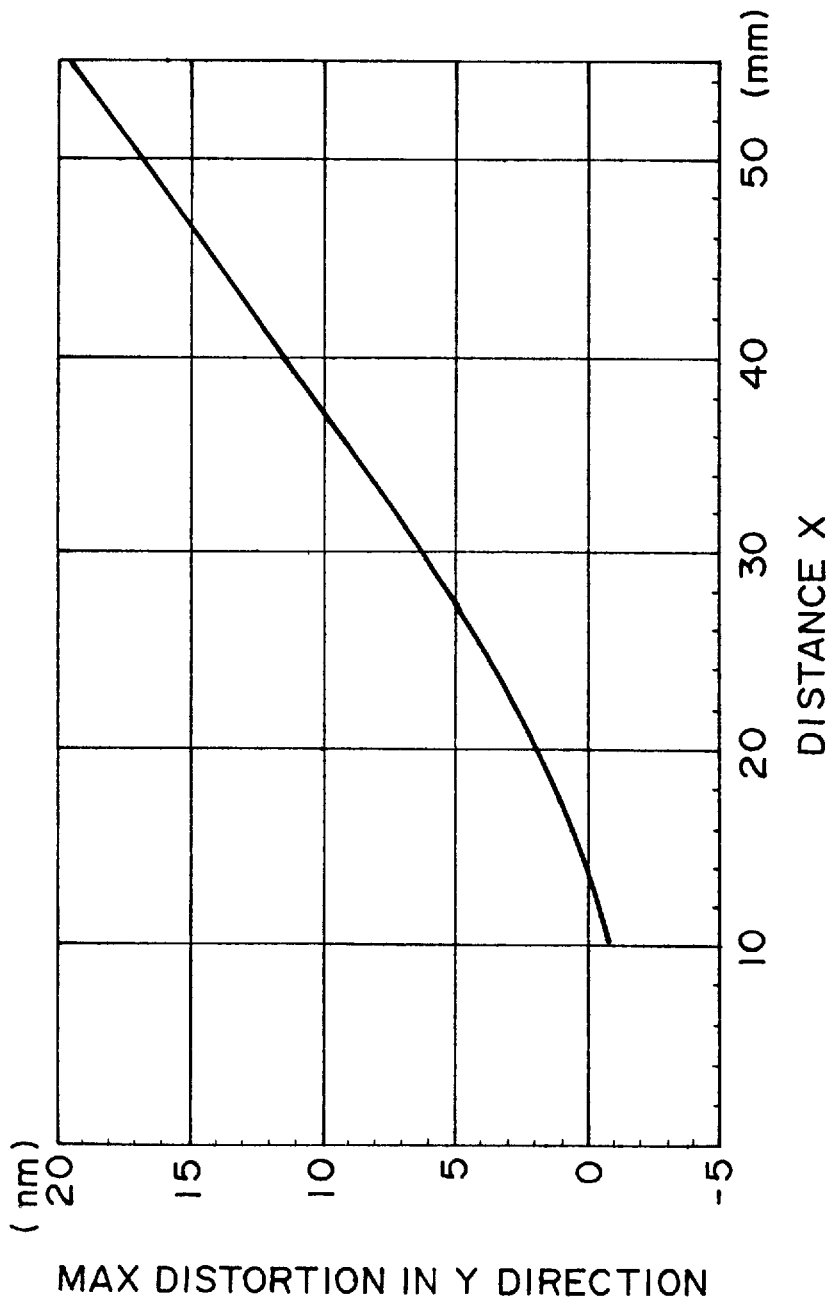
FIG. 9 is a graph for explaining maximum distortion of a membrane in the X direction, in the model of FIGS. 4A and 4B.
Figure 10:
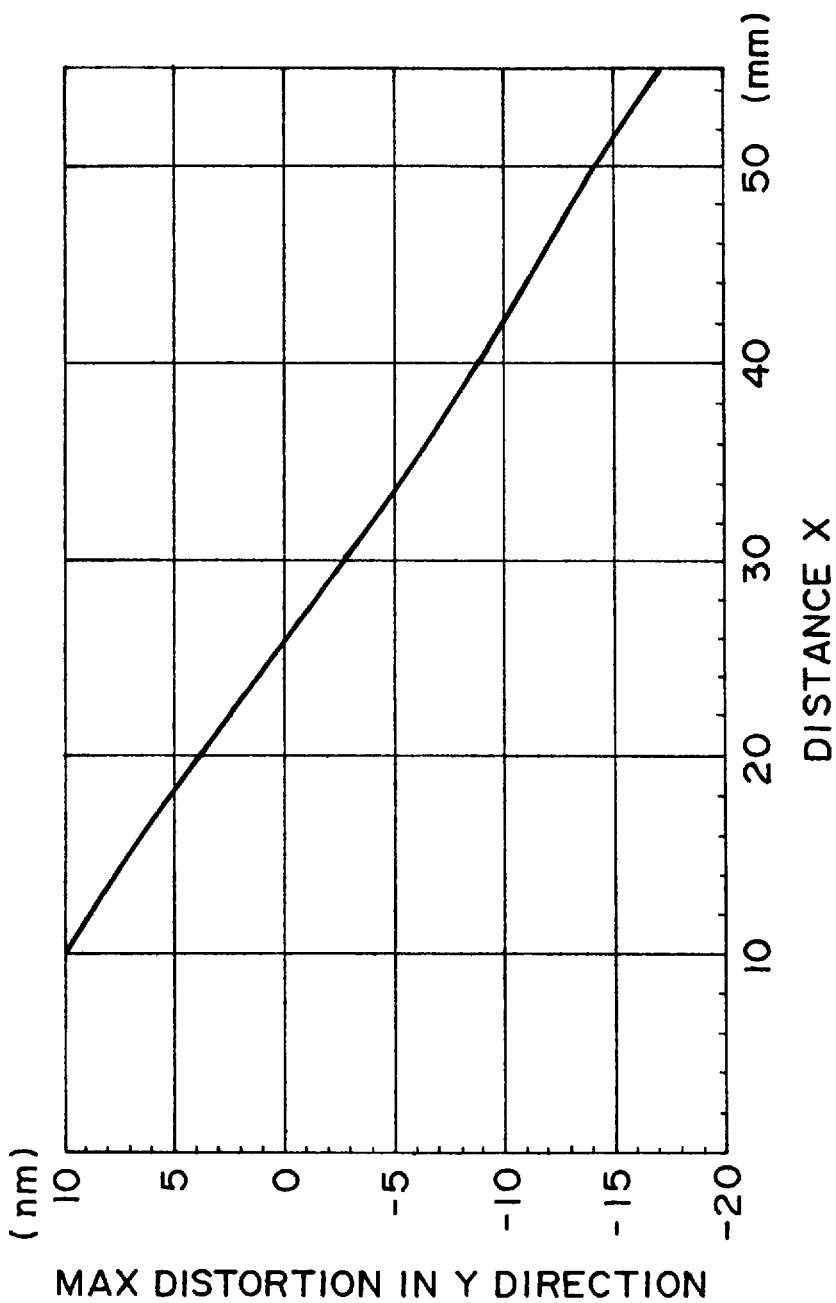
FIG. 10 is a graph for explaining maximum distortion of a membrane in the Y direction, in the model of FIGS. 4A and 4B.

FIG. 9 is a graph which shows the maximum distortion of the membrane 3 in the X direction, when in the model of FIGS. 4A and 4B the distance Y in the Y direction of the supporting member 5-3 and the pressing mechanism 6-3 from the center is 22 mm and when the distance X in the X direction of the supporting members 5-1 and 5-2 and the pressing mechanism 6-1 from the center is changed. Here, the amount of distortion is taken as the amount of change in length of the membrane in the X or Y direction. Similarly, FIG. 10 is a graph which shows maximum distortion of the membrane 3 in the Y direction, when the distance X in the X direction of the supporting members 5-1 and 5-2 and the pressing mechanism 6-1 is changed. As seen from FIG. 9, as regards the distortion in the X direction, it is about zero at a distance X of about 14 mm. Also, it is seen from FIG. 10 that, as regards the distortion in the Y direction, it becomes minimum at a distance X of about 26 mm.

It is seen from the above that the maximum distortion becomes equal to zero when the distances X and Y are substantially equal to each other. This may be construed that the external force applied to the membrane acts on it diagonally such that the distortion is small. Also, as regards the distances X and Y, when Y=44 mm, the distance X of zero distortion in the X direction and the distance X of zero distortion in the Y direction are equal to each other, but with a decrease in distance Y, the distance X of zero distortion in X direction and the distance X in zero distortion in the Y direction becomes different from each other. This may be construed so that, when the distance X becomes X<27.5 mm, the deformation becomes large because the membrane comprises a very thin film and it has a low rigidity.

Figure 11A:
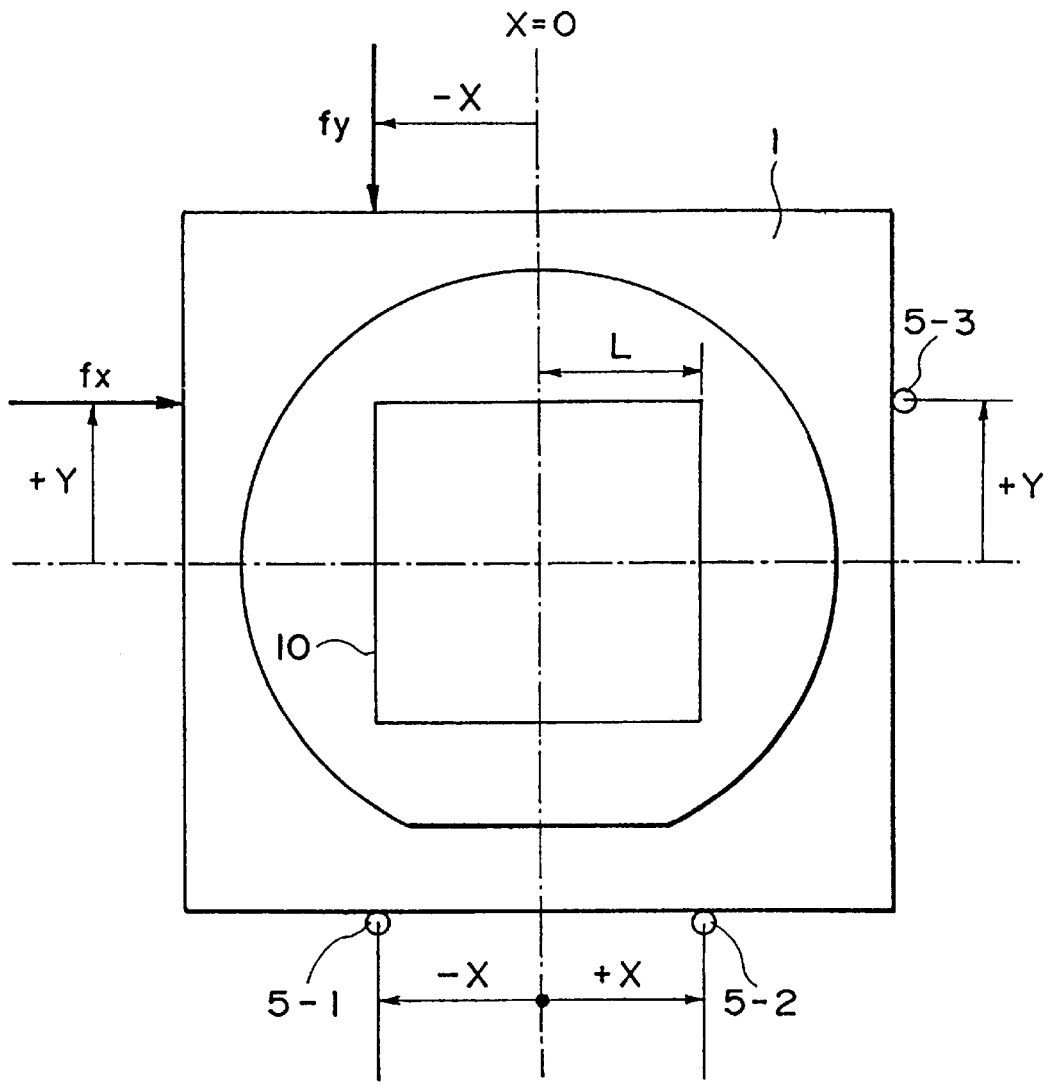
FIGS. 11A and 11B are schematic views, respectively, for explaining another model to be considered, in an embodiment of the present invention.
Figure 11B:
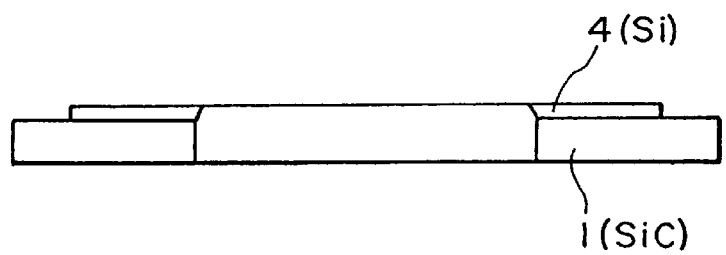
Figure 12:
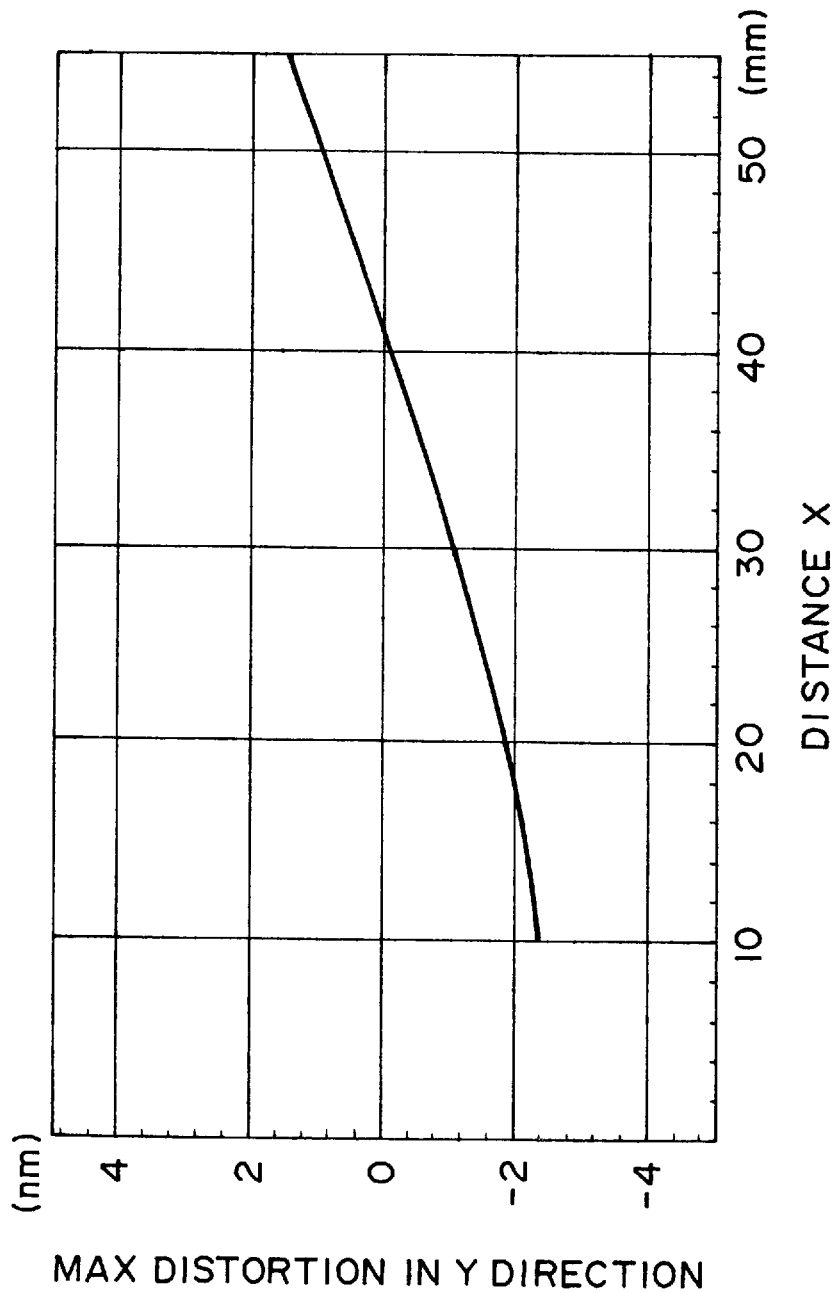
FIG. 12 is a graph for explaining maximum distortion of a membrane in the X direction, in the model of FIGS. 11A and 11B.

FIGS. 11A and 11B show a model when the frame 1 of FIGS. 4A and 4B is made of a material such as SiC. FIG. 12 is a graph which shows the maximum distortion of the membrane 3 in the X direction, when in the model of FIGS. 11A and 11B the distance Y in the Y direction of the supporting member 5-3 and the pressing mechanism 6-3 from the center is 44 mm and when the distance X in the X direction of the supporting members 5-1 and 5-2 and the pressing mechanism 6-1 from the center is changed. FIG. 13 is a graph which shows maximum distortion of the membrane 3 in the Y direction. As seen from FIG. 12, as regards the distortion in the X direction, it is about zero at a distance X of about 41 mm. Also, it is seen from FIG. 13 that, as regards the distortion in the Y direction, it becomes minimum at a distance X of about 46 mm.

Figure 15:
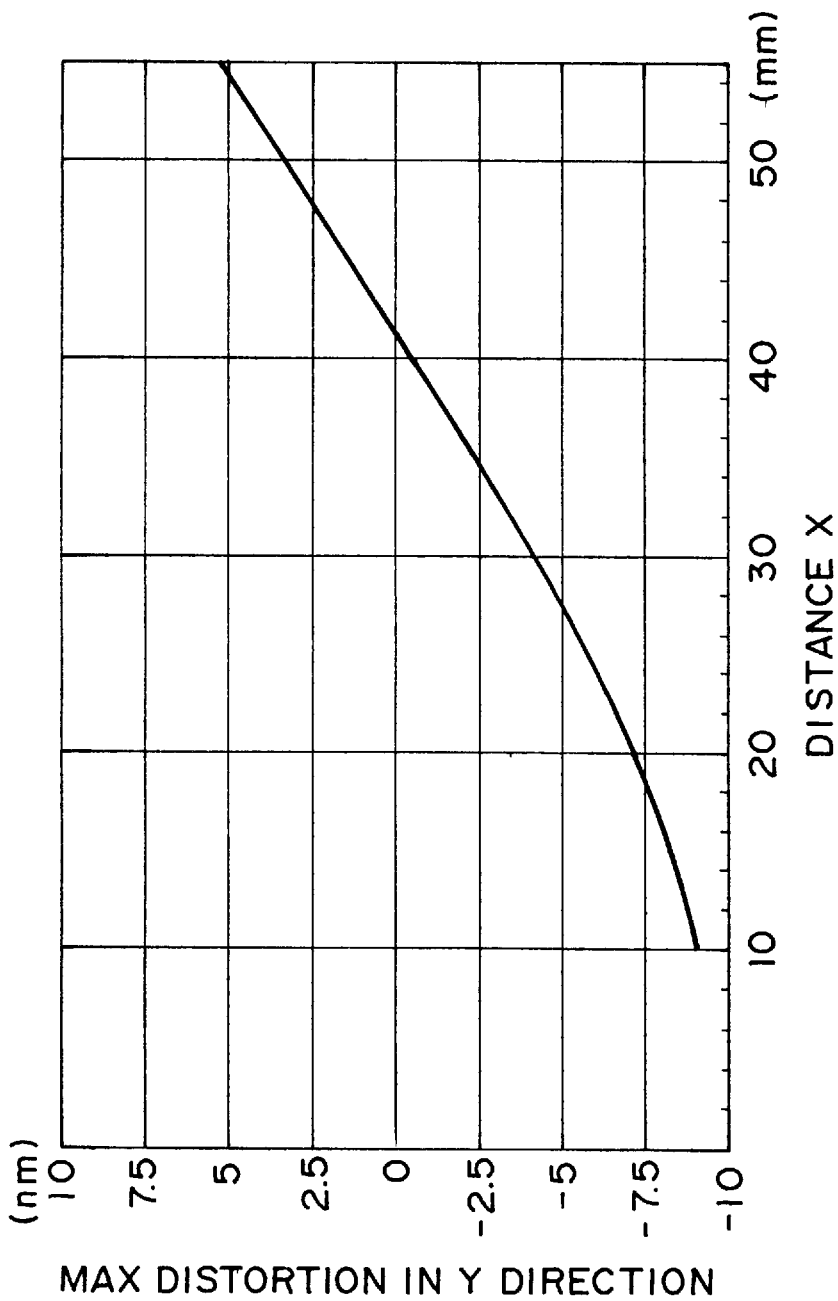
FIG. 15 is a graph for explaining maximum distortion of a membrane in the X direction, in the model of FIGS. 11A and 11B.

FIGS. 14A and 14B show a model when the frame 1 of FIGS. 4A and 4B has a thickness of 10 mm. FIG. 15 is a graph which shows the maximum distortion of the membrane 3 in the X direction, when in the model of FIGS. 14A and 14B the distance Y in the Y direction of the supporting member 5-3 and the pressing mechanism 6-3 from the center is 44 mm and when the distance X in the X direction of the supporting members 5-1 and 5-2 and the pressing mechanism 6-1 from the center is changed. FIG. 16 is a graph which shows maximum distortion of the membrane 3 in the Y direction. As seen from FIG. 15, as regards the distortion in the X direction, it is about zero at a distance X of about 42 mm. Also, it is seen from FIG. 16 that, as regards the distortion in the Y direction, it becomes minimum at a distance X of about 47 mm.

It is seen from the above that, regardless of a change in material or thickness of the frame, the maximum distortion in the X or Y direction is zero at a distance X of about 41–47 mm.

The models described above have been prepared for a case where the window 10 has a size of 55 mm square, this being selected to meet 4-gigabit DRAM size. Next, a case where the window 10 has a size of 33 mm square for 1-gigabit DRAM size, will be explained.

Figure 17A:
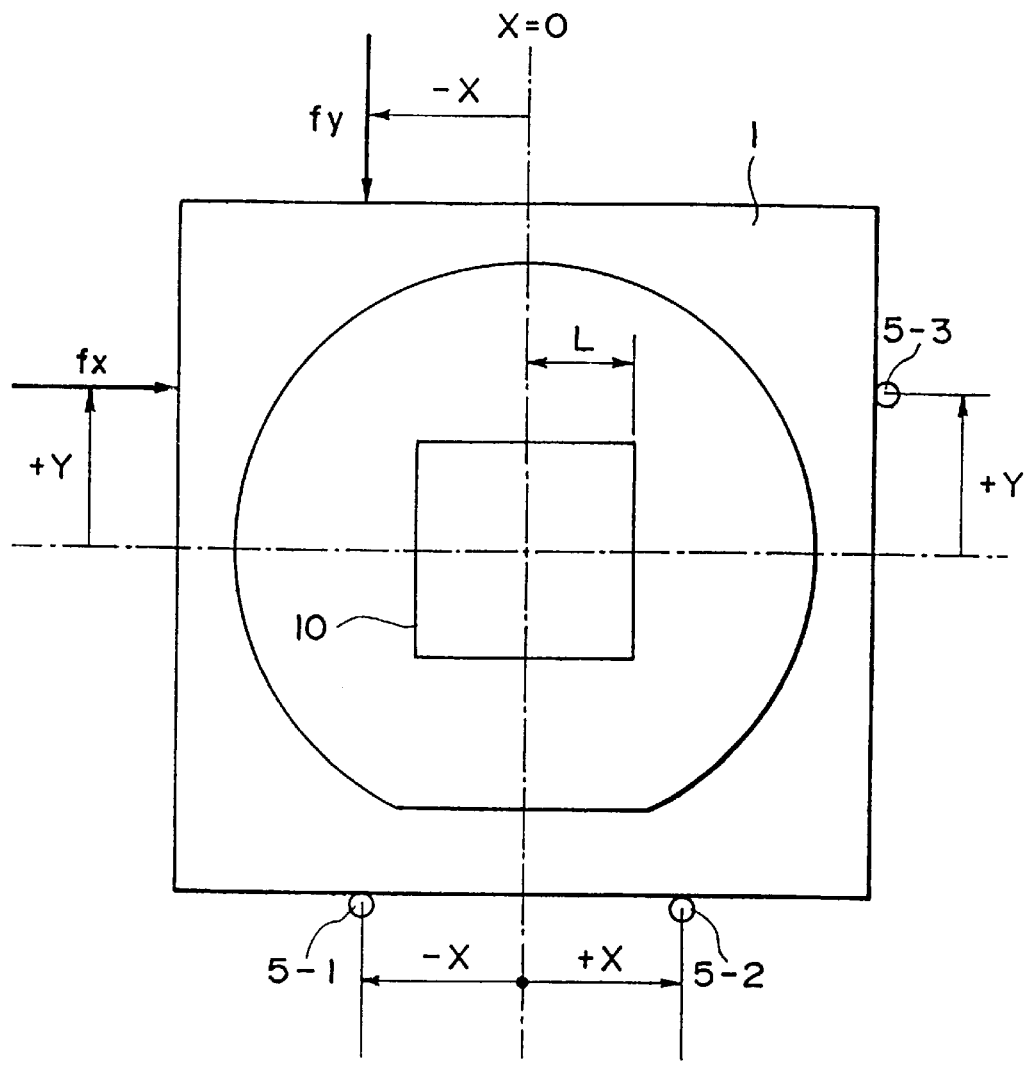
FIGS. 17A and 17B are schematic views, respectively, for explaining a further model to be considered, in an embodiment of the present invention.
Figure 17B:
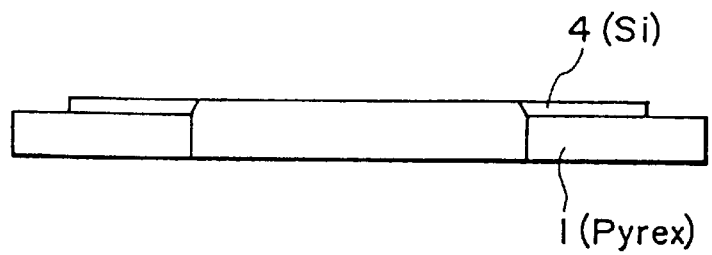
Figure 18:
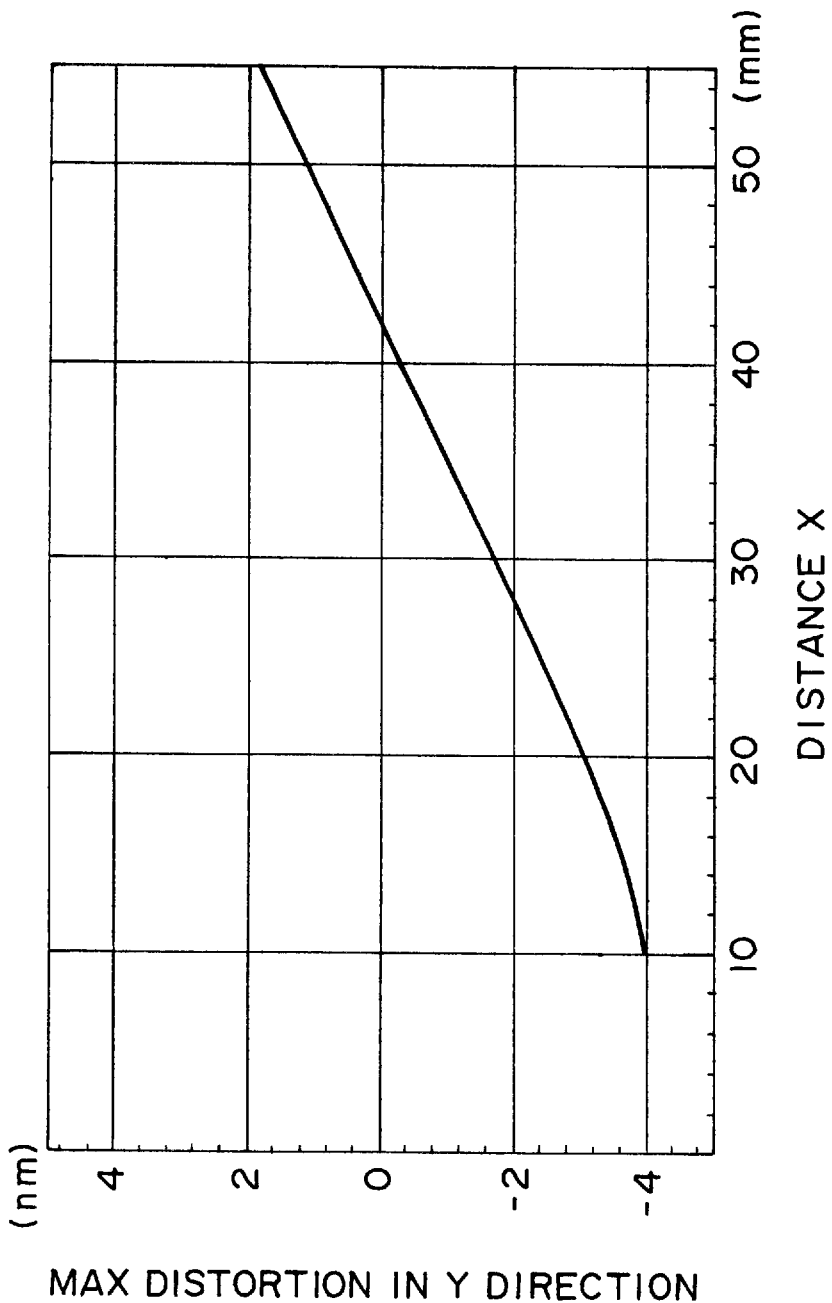
FIG. 18 is a graph for explaining maximum distortion of a membrane in the X direction, in the model of FIGS. 17A and 17B.
Figure 19:
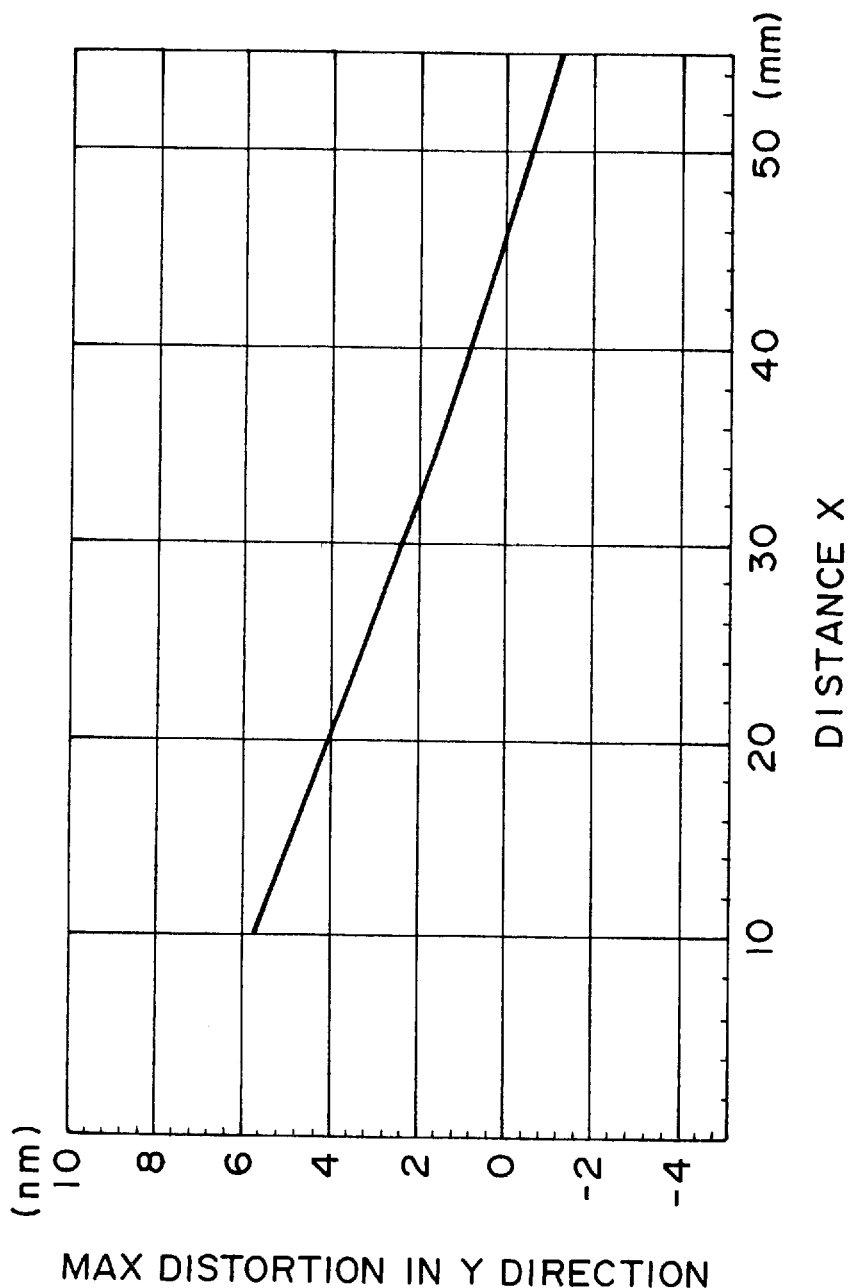
FIG. 19 is a graph for explaining maximum distortion of a membrane in the Y direction, in the model of FIGS. 17A and 17B.

FIGS. 17A and 17B show a model in this case. FIG. 18 is a graph which shows the maximum distortion of the membrane 3 in the X direction, when in the model of FIGS. 17A and 17B the distance Y in the Y direction of the supporting member 5-3 and the pressing mechanism 6-3 from the center is 44 mm and when the distance X in the X direction of the supporting members 5-1 and 5-2 and the pressing mechanism 6-1 from the center is changed. Here, the amount of distortion is taken as the amount of change in length of the membrane in the X or Y direction. Similarly, FIG. 19 is a graph which shows maximum distortion of the membrane 3 in the Y direction, when the distance X in the X direction of the supporting members 5-1 and 5-2 and the pressing mechanism 6-1 is changed. As seen from FIG. 18, as regards the distortion in the X direction, it is about zero at a distance X of about 42 mm. Also, it is seen from FIG. 19 that, as regards the distortion in the Y direction, it becomes minimum at a distance X of about 46 mm.

Figure 20:
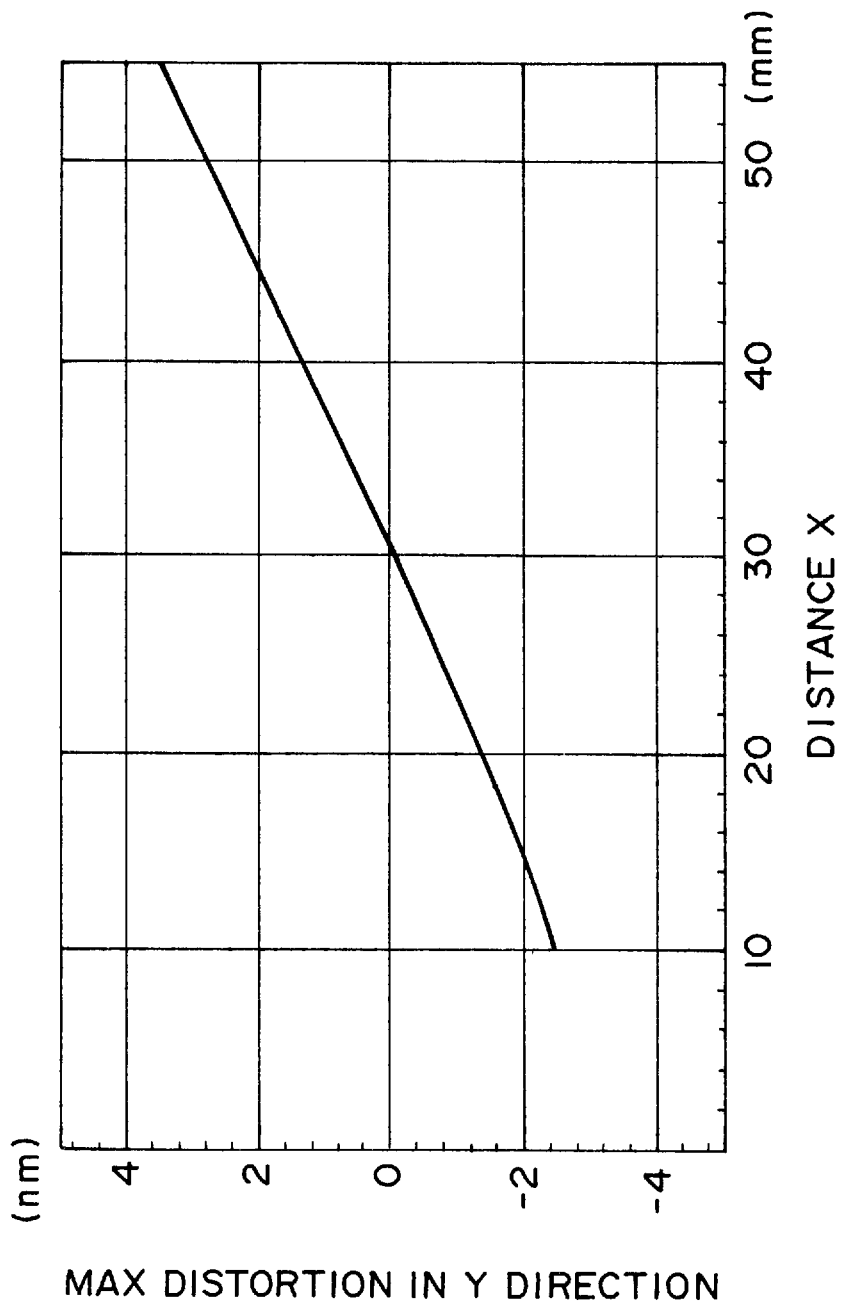
FIG. 20 is a graph for explaining maximum distortion of a membrane in the X direction, in the model of FIGS. 17A and 17B.
Figure 21:
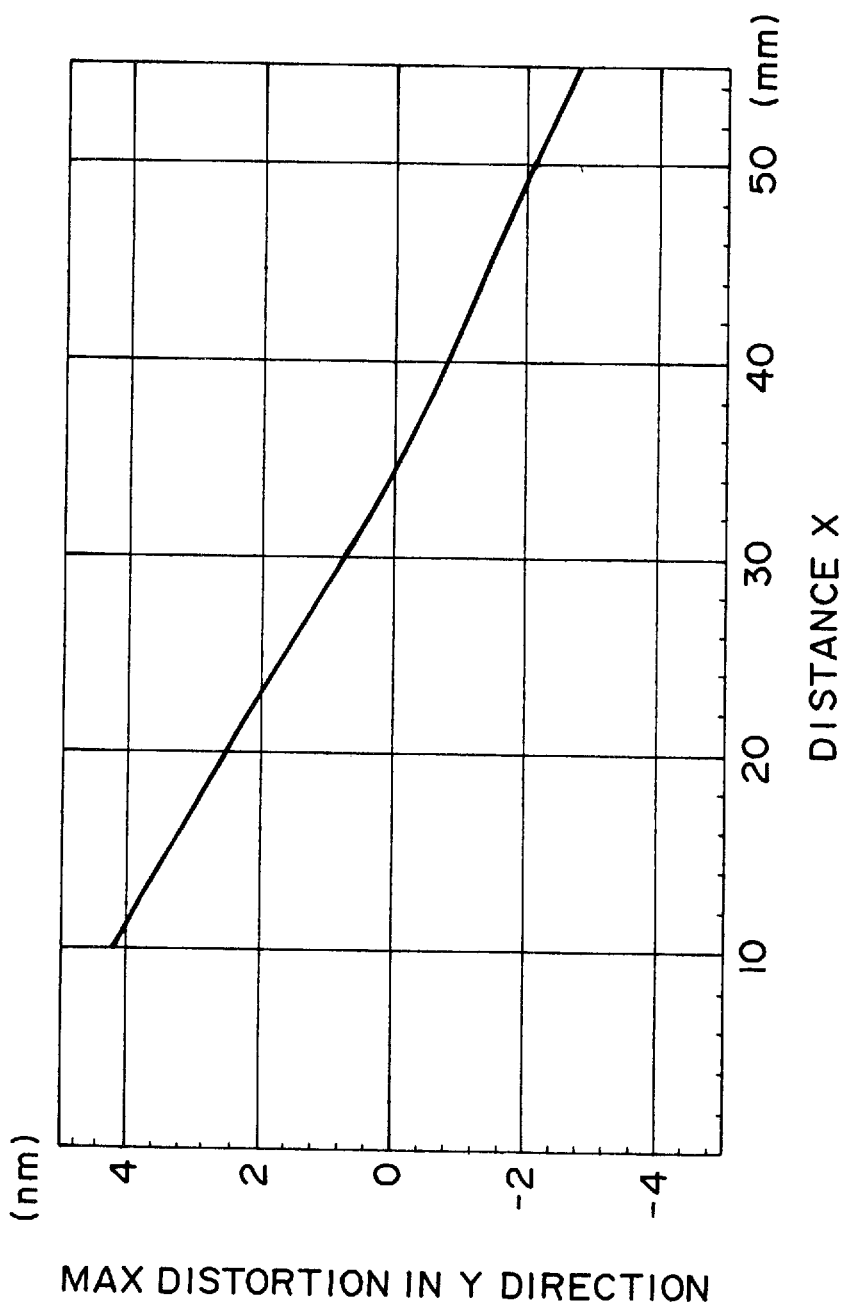
FIG. 21 is a graph for explaining maximum distortion of a membrane in the Y direction, in the model of FIGS. 17A and 17B.

FIG. 20 is a graph which shows the maximum distortion of the membrane 3 in the X direction, when in the model of FIGS. 17A and 17B the distance Y in the Y direction of the supporting member 5-3 and the pressing mechanism 6-3 from the center is 33 mm and when the distance X in the X direction of the supporting members 5-1 and 5-2 and the pressing mechanism 6-1 from the center is changed. Here, the amount of distortion is taken as the amount of change in length of the membrane in the X or Y direction. Similarly, FIG. 21 is a graph which shows maximum distortion of the membrane 3 in the Y direction, when the distance X in the X direction of the supporting members 5-1 and 5-2 and the pressing mechanism 6-1 is changed. As seen from FIG. 20, as regards the distortion in the X direction, it is about zero at a distance X of about 31 mm. Also, it is seen from FIG. 21 that, as regards the distortion in the Y direction, it becomes minimum at a distance X of about 35 mm.

Figure 22:
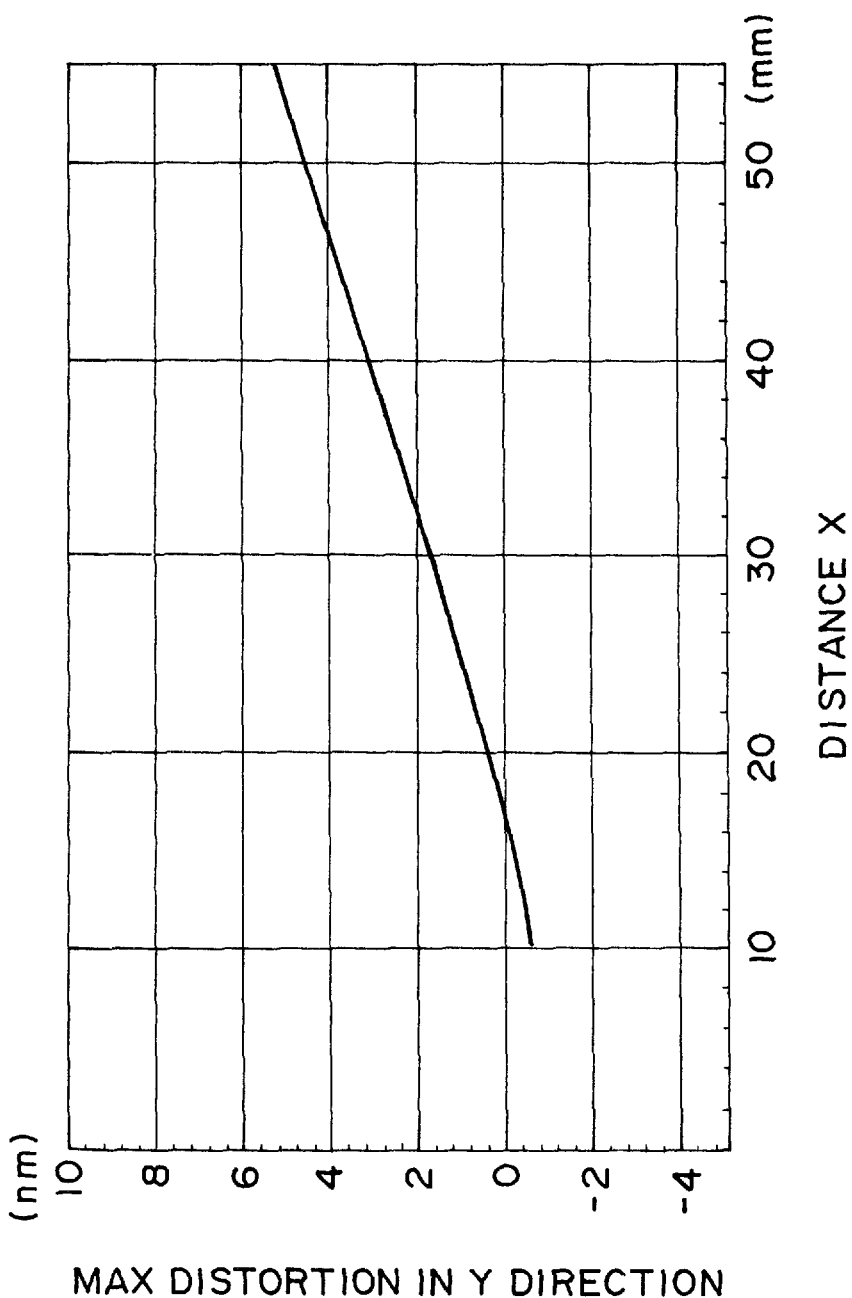
FIG. 22 is a graph for explaining maximum distortion of a membrane in the X direction, in the model of FIGS. 17A and 17B.
Figure 23:
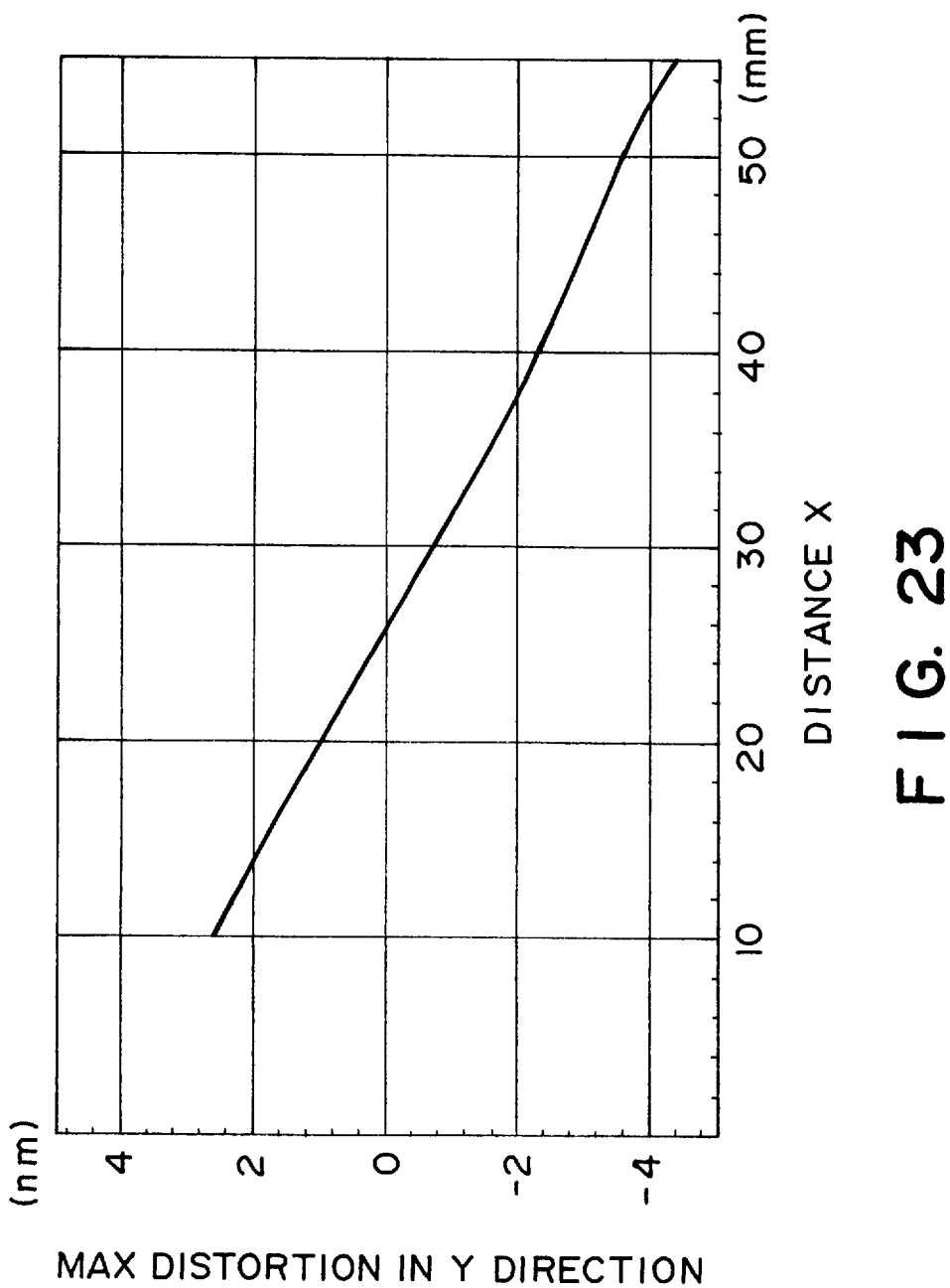
FIG. 23 is a graph for explaining maximum distortion of a membrane in the Y direction, in the model of FIGS. 17A and 17B.

FIG. 22 is a graph which shows the maximum distortion of the membrane 3 in the X direction, when in the model of FIGS. 17A and 17B the distance Y in the Y direction of the supporting member 5-3 and the pressing mechanism 6-3 from the center is 33 mm and when the distance X in the X direction of the supporting members 5-1 and 5-2 and the pressing mechanism 6-1 from the center is changed. Here, the amount of distortion is taken as the amount of change in length of the membrane in the X or Y direction. Similarly, FIG. 23 is a graph which shows maximum distortion of the membrane 3 in the Y direction, when the distance X in the X direction of the supporting members 5-1 and 5-2 and the pressing mechanism 6-1 is changed. As seen from FIG. 22, as regards the distortion in the X direction, it is about zero at a distance X of about 15 mm. Also, it is seen from FIG. 23 that, as regards the distortion in the Y direction, it becomes minimum at a distance X of about 26 mm.

It is seen from the above that, similar to the findings obtained with respect to the preceding models, the maximum distortion becomes equal to zero when the distances X and Y are substantially equal to each other. Also, as regards the distances X and Y, when Y=33 mm, the distance X of zero distortion in the X direction and the distance X of zero distortion in the Y direction are equal to each other, but with a decrease in distance Y, the distance X of zero distortion in the X direction and the distance X in zero distortion in the Y direction become different from each other.

Considering in combination with the findings obtained with respect to the preceding models, it is seen that, regardless of a change in material or thickness of the frame, the maximum distortion becomes equal to zero (optimum) when the distances X and Y are substantially equal to each other. With regard to a mask of analogous shape, naturally, similar results may be expected.

Also, setting the window 10 of the mask frame 1 to a size and shape substantially the same as those of the X-ray transmission area of the membrane, is effective to assure that the rigidity of the mask frame 1 is increased as much as possible while the deformation of the membrane 1 is suppressed as much as possible. Further, disposing the pressing point of the pressing mechanism to be opposed to the supporting point of the supporting member, is effective to minimize the deformation of the membrane 1.

While the forgoing description has been made of an example where a mask is held in upright position, the mask holding direction is not limited to this. Where the gravity is applied in a direction out of the mask surface, the pressing force may be determined while taking into account the product of "stage acceleration" and "mass of mask" or the product of "pressing force in the direction out of the surface" and "friction coefficient". Since the amount of positional deviation is substantially proportional to the pressing force, placing a supporting member and a pressing mechanism at the positions as proposed with reference to the above-described embodiment is very effective.

The embodiment of the present invention, as described above, uses a mask frame having an outside peripheral configuration of rectangular shape and having a window of rectangular shape. This facilitates easy improvement of machining precision of a frame and reduction of machining cost or inspection cost. Additionally, handling of a mask during a conveyance or positioning operation becomes quite easy. With the mask supporting process of the present embodiment, a mask can be positioned with respect to the X, Y and θ directions as well as to the Z direction, very precisely, while suppressing distortion of the mask pattern considerably. Thus, with the present embodiment, optimum structure of a mask as well as optimum support of the mask are both realized, which in combination provide significant advantageous results.

[Embodiment 2]

While the foregoing description has been made of an example of a mask chuck mechanism for use in an X-ray exposure apparatus, a similar mechanism may be employed in an EB pattern drawing apparatus for mask manufacture. A difference between these cases is that, in an X-ray exposure apparatus, a mask is held in an upright position along the direction of gravity, whereas in an EB drawing apparatus, a mask is held laid-down horizontally. Thus, if the pressing force is so controlled as to compensate for the effect of weight of the mask due to the gravity, it is possible to hold and position the mask substantially in the same condition both in the EB drawing apparatus and the X-ray exposure apparatus, regardless of the mask holding direction.

Figure 3A:
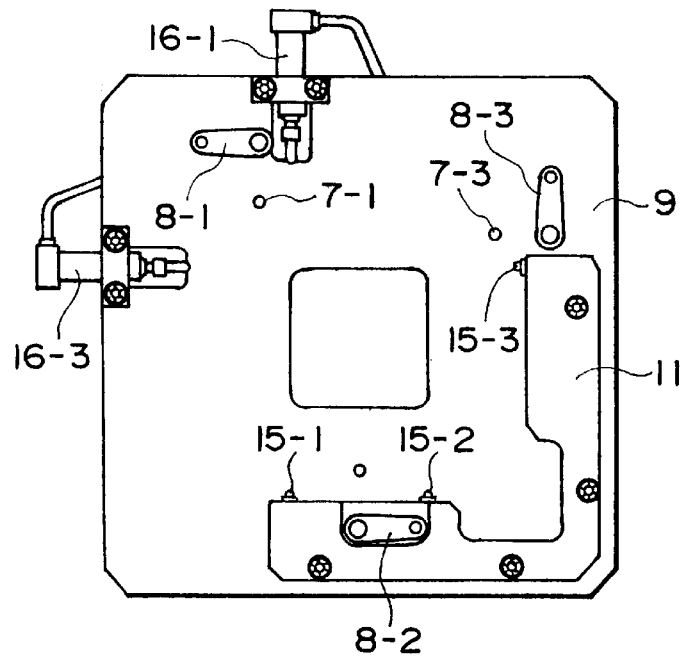
FIGS. 3A and 3B are schematic views, respectively, of a mask chuck mechanism according to another embodiment of the present invention.
Figure 3B:
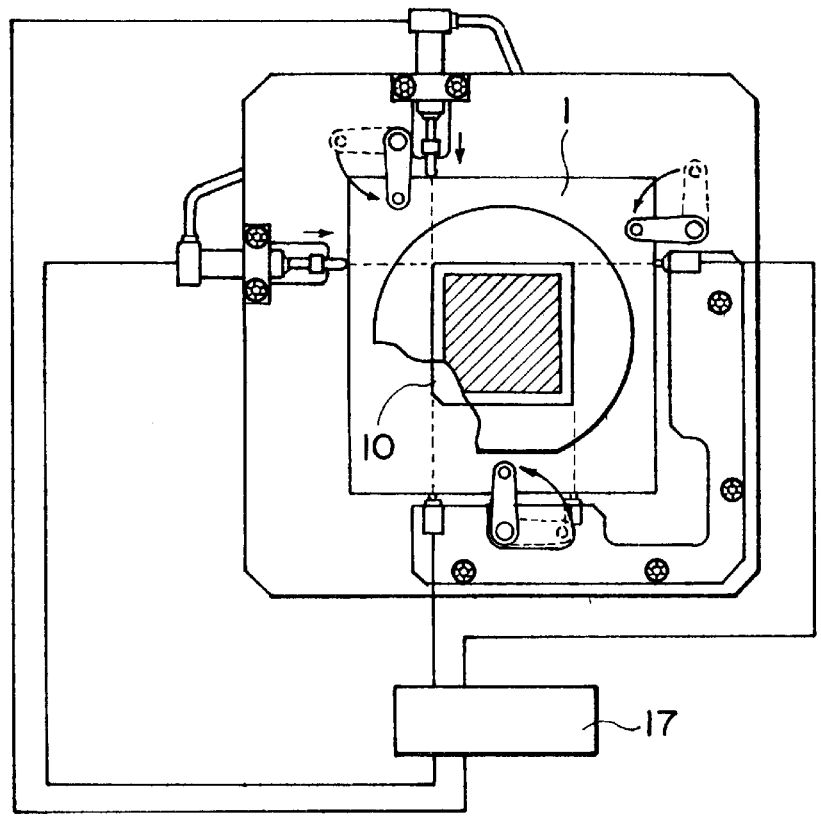

FIGS. 3A and 3B show the structure of a mask chuck mechanism to attain this, wherein the same reference numerals as those of FIGS. 2A and 2B are assigned to corresponding elements. It is to be noted that, as viewed in these drawings, in the case of an electron beam pattern drawing apparatus, gravity is applied in the direction perpendicular to the sheet of the drawing, whereas in an X-ray exposure apparatus, the gravity is applied downwardly.

A major difference of this embodiment from the embodiment of FIGS. 2A and 2B is that the X and Y supporting members 15-1, 15-2 and 15-3 each has a mask supporting function and, additionally, a pressure sensor function. Controller 17 controls the pressing forces of the pressing mechanisms 16-1, 16-2 and 16-3 to a desired level, on the basis of the pressure as detected through the pressure sensor function. This assures application of the same pressing force to the mask frame regardless of the mask holding direction, such that a very high membrane (pattern) distortion control precision is attained.

It has been confirmed through investigations made by the inventors of the subject application that the relative difference in positional deviation of the membrane, between that in an EB drawing apparatus and in an X-ray exposure apparatus, can be kept in a range of 1–2 nm. In accordance with this embodiment of the present invention, in addition to the advantageous results of the preceding embodiment, there is a significant effect of considerably high precision lithographic exposure operation because substantially no difference in pattern distortion is produced between during mask manufacture in an electron beam drawing apparatus and during use of a mask in an X-ray exposure apparatus.

[Embodiment 3]

Next, an embodiment of the present invention which is applied to an exposure apparatus for the manufacture of microdevices such as semiconductor devices, thin film magnetic heads or micro-machines, for example, with the use of a mask and/or a mask chuck described hereinbefore, will be explained.

Figure 24:
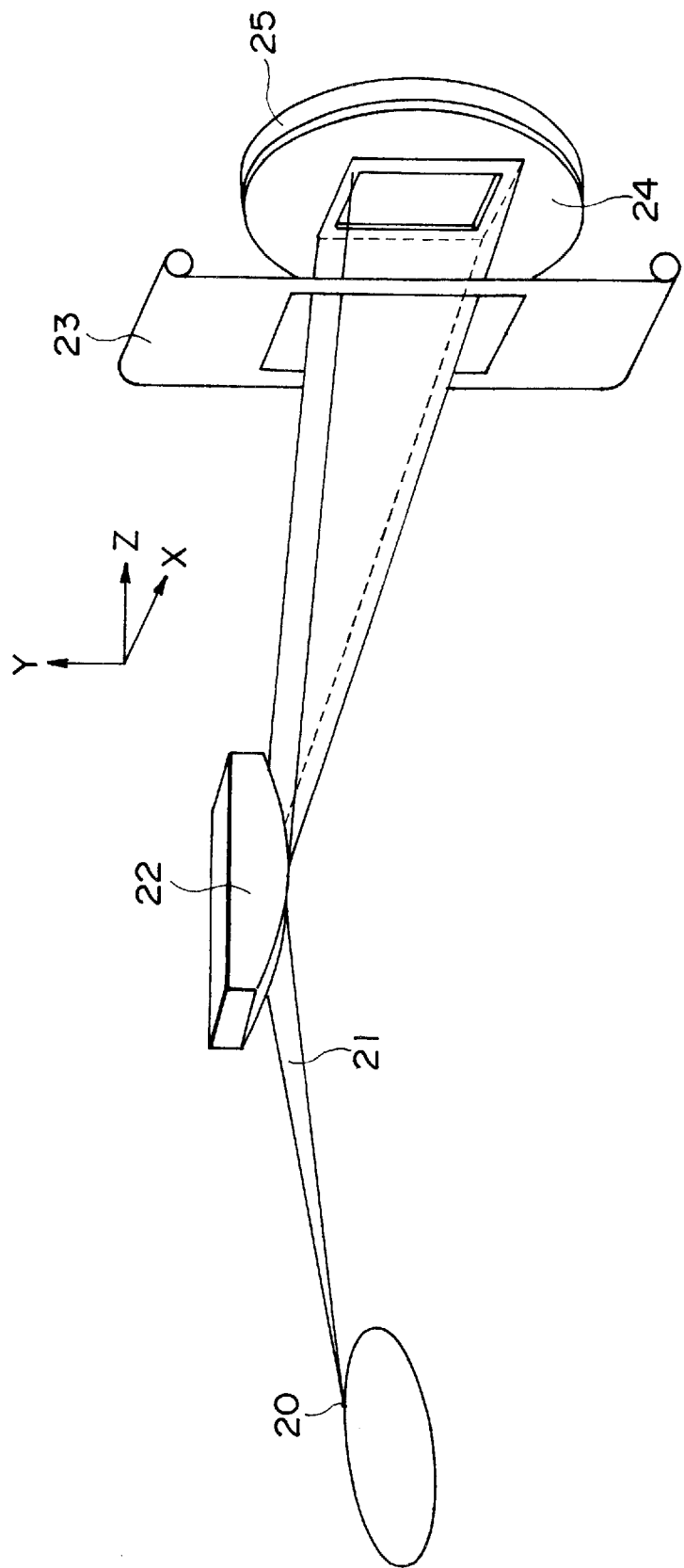
FIG. 24 is a schematic view of a general structure of an X-ray exposure apparatus.

FIG. 24 is a schematic view of the structure of an X-ray exposure apparatus according to this embodiment. In the drawing, synchrotron radiation light 21 of a sheet-like beam shape, emitted from an SR radiation source 20, is expanded by a convex surface mirror 22 in a direction perpendicular to the orbit plane of the radiation light. The radiation light reflectively expanded by the convex mirror 22 is adjusted by a shutter 23 so as to attain a uniform exposure amount within a region of illumination. The X-rays having been thus adjusted by the shutter 23 are directed to an X-ray mask 24. This X-ray mask 24 is held by a mask chuck mechanism of the same structure that has been explained hereinbefore. The X-ray mask 24 has a pattern which has been formed thereon by means of an electron beam pattern drawing apparatus as having been described, and this mask pattern is lithographically transferred to a wafer 25 through a step-and-repeat exposure process or a scan exposure process, for example.

Next, an embodiment of a semiconductor device manufacturing method which uses an exposure apparatus such as described above, will be explained.

Figure 25:
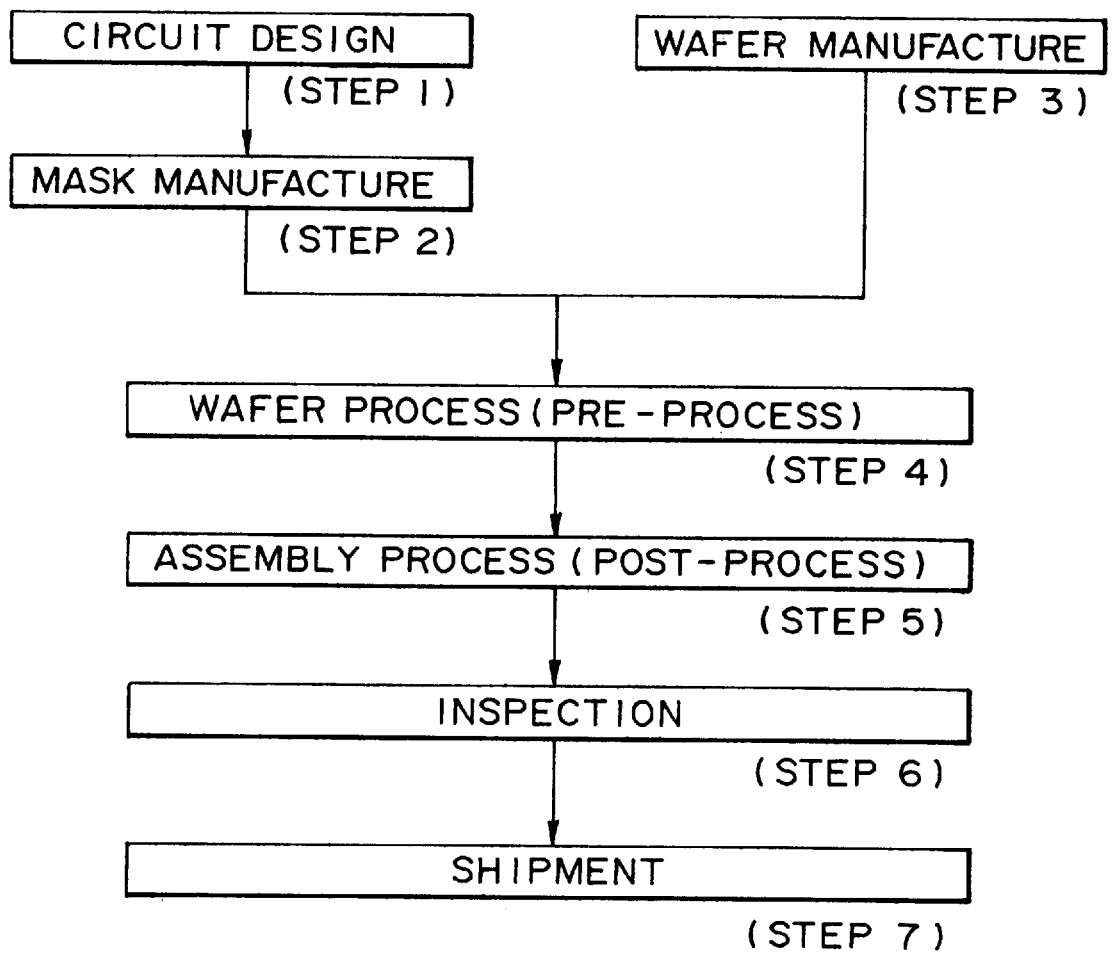
FIG. 25 is a flow chart of device manufacturing processes.

FIG. 25 is a flow chart of the sequence of manufacturing a semiconductor device such as a semiconductor chip (e.g., IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

FIG. 26 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A mask supporting method, comprising the steps of:
   providing a mask having a mask frame with a rectangular outside peripheral shape and a window having a rectangular shape analogous to the outside peripheral shape of the mask frame; and
   supporting the mask by supporting an outside periphery of the mask frame at (i) three supporting points and (ii) at least two pressing points substantially opposed to the supporting points, wherein each of the supporting points is disposed at or outwardly of a point of intersection between an extension of a side of the window of the mask frame and the outside periphery of the mask frame.

2. A method according to claim 1, wherein the distance from a longitudinal center line of the mask to one of the at least two pressing points and the distance from a transverse center line of the mask to the other of the at least two pressing points, are substantially equal to each other.

3. A method according to claim 1, wherein said supporting step comprises supporting the mask with a mask frame and wherein two of the three supporting points are disposed on one side of the outside periphery of the mask frame, and the remaining one supporting point is disposed on another side perpendicular to the one side.

4. A method according to claim 3, wherein the distances from a longitudinal center line of the mask to the two supporting points and the distance from a transverse center line of the mask to the remaining one supporting point are substantially equal to each other.

5. A method according to claim 1, wherein said supporting step comprises supporting the mask with a mask frame and the mask frame is supported at a plurality of points on its bottom surface.

6. A method according to claim 5, wherein the plural points comprises three points.

7. A mask supporting mechanism for supporting a mask having a mask frame with a rectangular outside peripheral shape and a window having a rectangular shape analogous to the outside peripheral shape of the mask frame, said mechanism comprising:
   three supporting members for supporting the outside periphery of the mask frame, wherein each of the supporting members is disposed at or outwardly of a point of intersection between an extension of a side of the window of the mask frame and the outside periphery of the mask frame; and
   at least two pressing mechanisms disposed substantially opposed to the supporting members for applying a pressing force to the mask frame in a direction parallel to the pattern surface of the mask.

8. A mask supporting mechanism according to claim 7, further comprising supporting means for supporting the bottom surface of the mask frame at a plurality of points.

9. An exposure apparatus, comprising:
   a mask supporting mechanism as recited in claim 8; and
   exposure means for exposing a mask supported by said mask supporting mechanism.

10. A device manufacturing method for manufacturing a microdevice, said method comprising:
    providing an exposure apparatus comprising:
    (i) a mask supporting mechanism as recited in claim 12; and
    (ii) exposure means for exposing a mask supported by the mask supporting mechanism; and
    exposing the mask supported by the supporting mechanism using the exposure means.

* * * * *

UNITED STATES PATENT AND TRADEMARK OFFICE
CERTIFICATE OF CORRECTION

PATENT NO. : 5,825,463

DATED : October 20, 1998

INVENTORS : SHINICHI HARA, ET AL.

It is certified that error appears in the above-identified patent and that said Letters Patent is hereby corrected as shown below:

ON THE COVER PAGE, Item [56],

Under "U.S. PATENT DOCUMENTS", before the last line, the following should be inserted
--5,471,279  11/1995  Takizawa--.

COLUMN 1:

line 23, "an" should read --received--; and
    line 48, "in" should read --on--.

COLUMN 4:

line 42, "there is" should be deleted.

COLUMN 5:

line 41, "those" should be deleted; and
    line 42, "as" should read --as those--.

UNITED STATES PATENT AND TRADEMARK OFFICE
CERTIFICATE OF CORRECTION

PATENT NO. : 5,825,463

DATED : October 20, 1998

INVENTORS : SHINICHI HARA, ET AL.

Page 2 of 2

It is certified that error appears in the above-identified patent and that said Letters Patent is hereby corrected as shown below:

COLUMN 7:

line 7, "in" (second occurrence) should read --in the--.

COLUMN 9:

line 44, "the" should be deleted;
    line 63, "of" should read --of a--;
    line 65, "between" should read --between that--; and
    line 66, "and" should read --and that--.

COLUMN 12:

line 2, "comprises" should read --comprise--; and
    line 32, the left margin should be closed up.

Signed and Sealed this

Twenty-ninth Day of June, 1999

*Attest:*

Q. TODD DICKINSON

*Attesting Officer*     Acting Commissioner of Patents and Trademarks